US012563872B2

(12) United States Patent (10) Patent No.: US 12,563,872 B2
Kim et al. (45) Date of Patent: Feb. 24, 2026

(54) DISPLAY DEVICE, MANUFACTURING METHOD OF LIGHT EMITTING ELEMENT, AND MANUFACTURING METHOD OF DISPLAY DEVICE INCLUDING LIGHT EMITTING ELEMENT MANUFACTURED THEREBY

(71) Applicant: Samsung Display Co., LTD., Yongin-si (KR)

(72) Inventors: Su Jeong Kim, Yongin-si (KR); Jin Wan Kim, Yongin-si (KR); Seung Geun Lee, Yongin-si (KR); Sang Jo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 807 days.

(21) Appl. No.: 17/829,916

(22) Filed: Jun. 1, 2022

(65) Prior Publication Data

US 2023/0061476 A1 Mar. 2, 2023

(30) Foreign Application Priority Data

Aug. 30, 2021 (KR) ........................ 10-2021-0114696

(51) Int. Cl.
H10H 20/831 (2025.01)
H10H 20/01 (2025.01)
(Continued)

(52) U.S. Cl.
CPC .... H10H 20/8312 (2025.01); H10H 20/0137 (2025.01); H10H 20/825 (2025.01);
(Continued)

(58) Field of Classification Search
None
See application file for complete search history.

(56) References Cited

U.S. PATENT DOCUMENTS 9,172,008 B2 * 10/2015 Hwang ................ H10H 20/815
9,206,524 B2 12/2015 Zhang et al.
(Continued)

FOREIGN PATENT DOCUMENTS

CN 115274740 A * 11/2022 ........... H01L 27/156
CN 115280612 A * 11/2022 ......... H01L 5/18369
(Continued)

OTHER PUBLICATIONS

International Search Report, corresponding to International Application No. PCT/KR2022/012880, dated Nov. 23, 2022.

*Primary Examiner* — Michael Lebentritt
(74) *Attorney, Agent, or Firm* — Womble Bond Dickinson (US) LLP

(57) ABSTRACT

A display device includes a first electrode and a second electrode that are disposed on a substrate, a light emitting element disposed on the first electrode and the second electrode, a first contact electrode electrically connecting the first electrode and the light emitting element to each other, and a second contact electrode electrically connecting the second electrode and the light emitting element to each other. The light emitting element includes a first semiconductor layer including a semiconductor of a first type, a second semiconductor layer including a semiconductor of a second type, and an active layer disposed between the first semiconductor layer and the second semiconductor layer. The first semiconductor layer includes a doped semiconductor layer including a porous structure.

15 Claims, 17 Drawing Sheets

(51) Int. Cl.
 H10H 20/825 (2025.01)
 H10H 20/857 (2025.01)

(52) U.S. Cl.
 CPC ......... H10H 20/857 (2025.01); H10H 20/032 (2025.01); H10H 20/0364 (2025.01)

(56) References Cited

U.S. PATENT DOCUMENTS

| | | | |
|---|---|---|---|
| 9,356,187 B2 | 5/2016 | Ryu et al. | |
| 10,554,017 B2 | 2/2020 | Han et al. | |
| 11,049,995 B2 * | 6/2021 | Yoo | H10H 20/825 |
| 2006/0285566 A1 * | 12/2006 | Ueki | H01S 5/18341 |
| | | | 372/45.01 |
| 2013/0105828 A1 * | 5/2013 | Kim | H10H 29/142 |
| | | | 257/E33.002 |
| 2017/0279008 A1 * | 9/2017 | You | H10H 20/819 |

| | | | |
|---|---|---|---|
| 2020/0227255 A1 | 7/2020 | Zhu et al. | |
| 2021/0202452 A1 * | 7/2021 | Kim | H10H 20/857 |
| 2022/0336527 A1 * | 10/2022 | Cha | H10H 20/01 |

FOREIGN PATENT DOCUMENTS

| | | | | |
|---|---|---|---|---|
| CN | 116072789 A * | 5/2023 | | H01L 33/18 |
| CN | 118488747 A * | 8/2024 | | G09G 3/3208 |
| EP | 4024461 A1 * | 7/2022 | | H01L 25/0753 |
| JP | 5961557 | 8/2016 | | |
| JP | 2018-517295 | 6/2018 | | |
| KR | 10-1278063 | 6/2013 | | |
| KR | 10-1424405 | 7/2014 | | |
| KR | 10-2014-0095390 | 8/2014 | | |
| KR | 10-2014-0099071 | 8/2014 | | |
| KR | 10-2017-0134222 | 12/2017 | | |
| KR | 10-2018-0087609 | 8/2018 | | |
| KR | 10-2021-0031588 | 3/2021 | | |
| KR | 10-2021-0086805 | 7/2021 | | |

* cited by examiner

ELL
SEC2
AL
160
140 } SEC1
120

ELL
SEC2
AL
160
140 } SEC1
120
INF

EP1

1

DISPLAY DEVICE, MANUFACTURING METHOD OF LIGHT EMITTING ELEMENT, AND MANUFACTURING METHOD OF DISPLAY DEVICE INCLUDING LIGHT EMITTING ELEMENT MANUFACTURED THEREBY

CROSS-REFERENCE TO RELATED APPLICATION(S)

The application claims priority to and benefits of Korean patent application 10-2021-0114696 under 35 U.S.C. § 119(a), filed on Aug. 30, 2021 in the Korean Intellectual Property Office, the entire contents of which are incorporated herein by reference.

BACKGROUND

1. Technical Field

The disclosure relates to a display device, a manufacturing method of a light emitting element, and a manufacturing method of a display device including a light emitting element manufactured thereby.

2. Description of the Related Art

Recently, as interest in information displays increases, research and development of display devices is being continuously conducted.

SUMMARY

Embodiments include a display device, a manufacturing method of a light emitting element, and a manufacturing method of a display device including a light emitting element manufactured thereby, in which a strain of layers included in the light emitting element may be reduced, and a defect may be decreased, thereby improving the light emission efficiency of the light emitting element.

In accordance with an aspect of the disclosure, there is provided a display device that may include a first electrode and a second electrode that are disposed on a substrate, a light emitting element disposed on the first electrode and the second electrode, a first contact electrode electrically connecting the first electrode and the light emitting element to each other, and a second contact electrode electrically connecting the second electrode and the light emitting element to each other. The light emitting element may include a first semiconductor layer including a semiconductor of a first type, a second semiconductor layer including a semiconductor of a second type, and an active layer disposed between the first semiconductor layer and the second semiconductor layer. The first semiconductor layer may include a doped semiconductor layer including a porous structure.

A dopant of a first concentration may be provided in the doped semiconductor layer. The first semiconductor layer may further include a defect prevention layer disposed on the doped semiconductor layer, and the defect prevention layer may include a dopant of a second concentration lower than the first concentration.

The defect prevention layer may be disposed between the doped semiconductor layer and the active layer.

The doped semiconductor layer may be disposed between the defect prevention layer and the active layer.

The first semiconductor layer may further include an adjacent defect prevention layer disposed between the doped semiconductor layer and the active layer, and the adjacent defect prevention layer may include a dopant of a third concentration lower than the first concentration.

The first semiconductor layer may further include a strain relief layer having a superlattice structure.

The strain relief layer may have a structure including a first relief layer and a second relief layer different from the first relief layer alternately disposed.

The first relief layer may include InGaN, and the second relief layer may include GaN.

The defect prevention layer may be disposed between the doped semiconductor layer and the strain relief layer.

The doped semiconductor layer may be disposed between the defect prevention layer and the strain relief layer.

The first semiconductor layer may further include an adjacent defect prevention layer disposed between the doped semiconductor layer and the active layer, the adjacent defect prevention layer may include a dopant of a third concentration lower than the first concentration. The doped semiconductor layer may be disposed between the defect prevention layer and the adjacent defect prevention layer. The adjacent defect prevention layer may be disposed between the doped semiconductor layer and the strain relief layer.

A surface of the doped semiconductor layer may be in contact with a surface of the defect prevention layer.

The defect prevention layer may be disposed between the doped semiconductor layer and the strain relief layer. Another surface of the defect prevention layer may be in contact with a surface of the strain relief layer.

A plurality of light emitting elements may be provided, and at least portion of the plurality of light emitting elements may emit red light.

A concentration of a dopant doped into the doped semiconductor layer may be about $10^{15}$ to about $10^{19}$ per unit area (cm$^3$).

The light emitting element may include a first end portion and a second end portion. The first contact electrode may cover the second end portion of the light emitting element, and the second contact electrode may cover the first end portion of the light emitting element.

In accordance with another aspect of the disclosure, there is provided a method of manufacturing a light emitting element. The method may include forming an undoped semiconductor layer on a stack substrate, forming a first semiconductor layer on the undoped semiconductor layer, forming an active layer on the first semiconductor layer, forming a second semiconductor layer on the active layer, and providing a light emitting element by etching the first semiconductor layer, the active layer, and the second semiconductor layer in a thickness direction of the stack substrate. The forming of the first semiconductor layer may include forming a doped semiconductor layer. The method may include performing an electro-chemical etching process on the doped semiconductor layer.

A dopant at a first concentration may be provided in the doped semiconductor layer. The forming of the first semiconductor layer may further include forming, on the doped semiconductor layer, a defect prevention layer having a dopant of a second concentration lower than the first concentration layer.

A dopant of a first concentration may be provided in the doped semiconductor layer. The forming of the first semiconductor layer may further include forming a defect prevention layer having a dopant of a second concentration lower than the first concentration. The forming of the defect prevention layer may be performed before the forming of the doped semiconductor layer.

The forming of the first semiconductor layer may further include forming an adjacent defect prevention layer having a dopant of a third concentration lower than the first concentration. The forming of the adjacent defect prevention layer may be performed after the forming of the doped semiconductor layer.

The forming of the first semiconductor layer may further include forming a strain relief layer having a superlattice structure on the defect prevention layer.

The forming of the first semiconductor layer may further include forming a strain relief layer having a superlattice structure on the doped semiconductor layer.

The forming of the first semiconductor layer may further include forming a strain relief layer having a superlattice structure on the adjacent defect prevention layer.

The performing of the electro-chemical etching process may include forming a porous structure in the doped semiconductor layer.

The forming of the strain relief layer may include forming a first relief layer and, forming a second relief layer.

A concentration of a dopant doped into the doped semiconductor layer may be about $10^{15}$ to about $10^{19}$ per unit area $(cm^3)$.

The performing of the electro-chemical etching process may be performed before the forming of the active layer.

In accordance with still another aspect of the disclosure, there is provided a method of manufacturing a display device. The method may include disposing a first electrode and a second electrode on a substrate, forming an insulating layer over the first electrode and the second electrode, providing an ink including the light emitting element and a solvent, forming an electric field between the first electrode and the second electrode, forming a base contact electrode over the light emitting element, and providing a first contact electrode and a second contact electrode by etching the base contact electrode. The light emitting element may include a first semiconductor layer including a doped semiconductor layer including a porous structure.

The light emitting element may include a first end portion facing the second electrode and a second end portion facing the first electrode. The forming of the base contact electrode may include overlapping, by the base contact electrode, with the first end portion and the second end portion in a plan view. The providing of the first contact electrode and the second contact electrode may include covering, by the first contact electrode, the second end portion of the light emitting element, and covering, by the second contact electrode, the first end portion of the light emitting element.

The forming of the electric field may include arranging the light emitting element between the first electrode and the second electrode with the electric field.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

FIGS. 1 and 2 are perspective and sectional views schematically illustrating a light emitting element in accordance with a first embodiment of the disclosure.

DETAILED DESCRIPTION OF THE EMBODIMENTS

Figure 3:
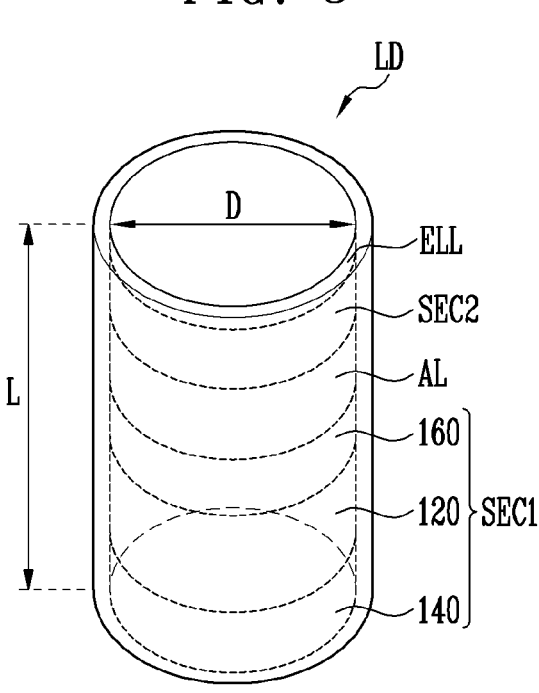
FIGS. 3 and 4 are perspective and sectional views schematically illustrating a light emitting element in accordance with a second embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The drawings attached to the specification are provided to explain the disclosure, and the shapes shown in the drawings may be exaggerated and displayed as necessary to aid in understanding the disclosure, and thus the disclosure is not limited to the drawings.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the specification, when it is determined that a detailed description of a known configuration or function related to the disclosure may obscure the gist of the disclosure, a detailed description thereof may be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The disclosure generally relates to a display device, a manufacturing method of a light emitting element, and a manufacturing method of a display device including a light emitting element manufactured thereby.

Hereinafter, a display device, a manufacturing method of a light emitting element, and a manufacturing method of a display device including a light emitting element manufactured thereby in accordance with embodiments of the disclosure will be described with reference to the accompanying drawings.

Figures 1, 2:
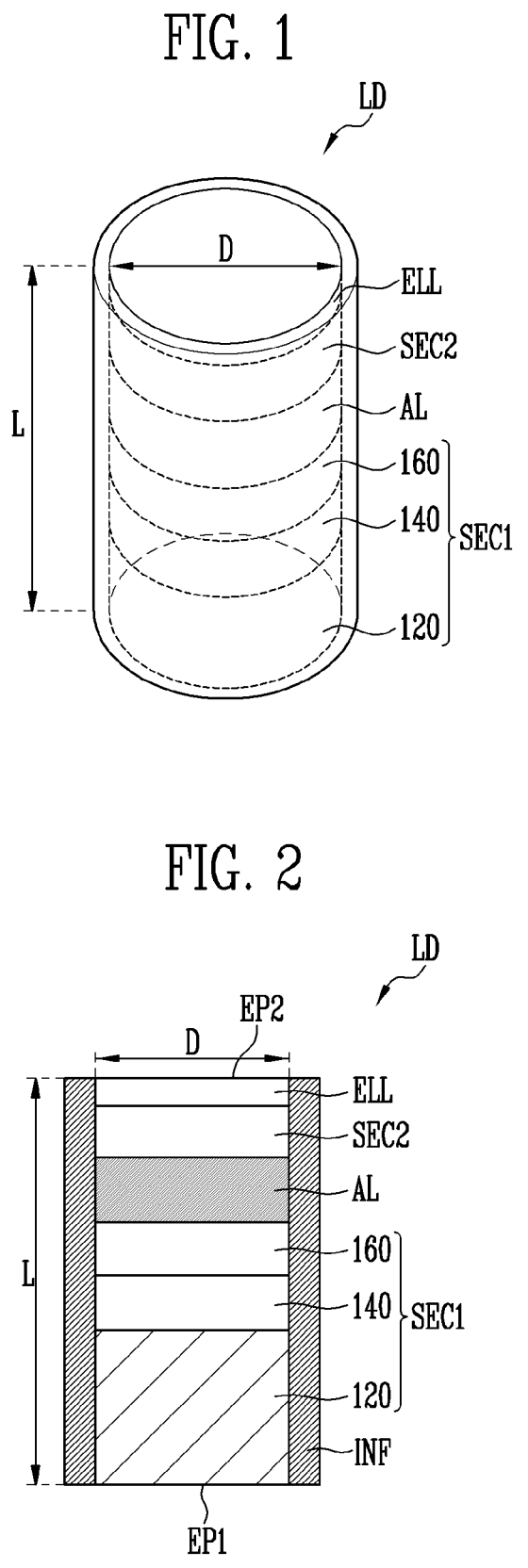

First, light emitting elements LD in accordance with embodiments of the disclosure will be described with reference to FIGS. 1 to 6. The light emitting elements LD included in a display device DD in accordance with an embodiment of the disclosure are illustrated in FIGS. 1 to 6.

Figure 4:
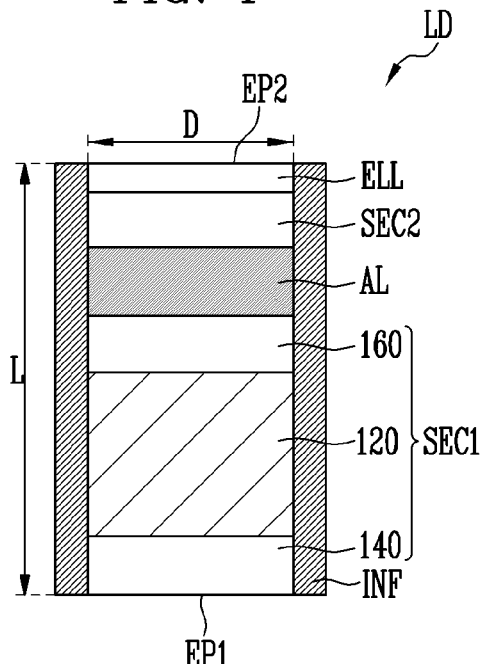
Figure 5:
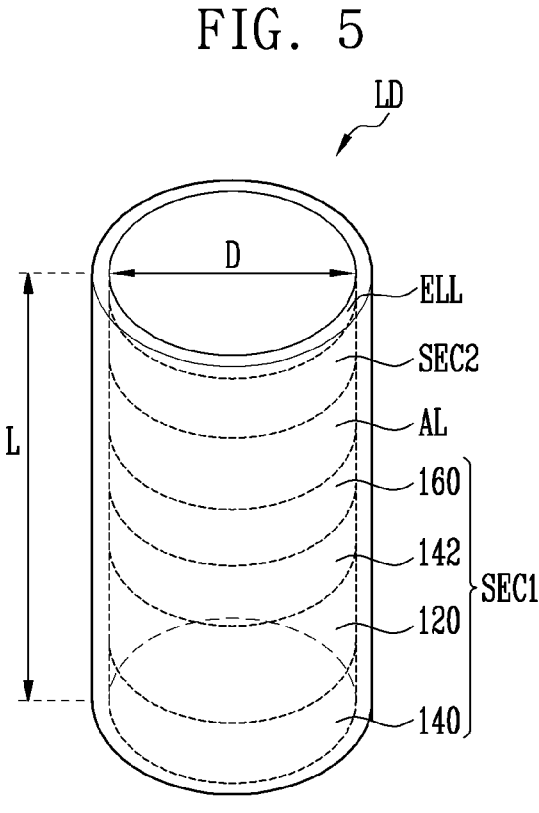
FIGS. 5 and 6 are perspective and sectional views schematically illustrating a light emitting element in accordance with a third embodiment of the disclosure.
Figure 6:
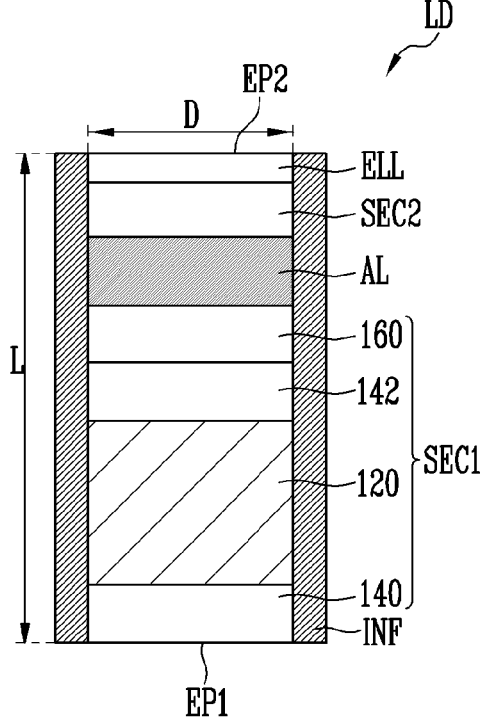

FIGS. 1 and 2 are perspective and sectional views schematically illustrating a light emitting element in accordance with a first embodiment of the disclosure. FIGS. 3 and 4 are perspective and sectional views schematically illustrating a light emitting element in accordance with a second embodiment of the disclosure. FIGS. 5 and 6 are perspective and sectional views schematically illustrating a light emitting element in accordance with a third embodiment of the disclosure.

First, the light emitting element LD in accordance with the first embodiment of the disclosure will be described with reference to FIGS. 1 and 2.

Referring to FIGS. 1 and 2, the light emitting element LD may include a first semiconductor layer SEC1, a second semiconductor layer SEC2, and an active layer AL interposed between the first semiconductor layer SEC1 and the second semiconductor layer SEC2. The light emitting element LD may further include an electrode layer ELL.

In accordance with an embodiment, the first semiconductor layer SEC1, the active layer AL, the second semiconductor layer SEC2, and the electrode layer ELL may be sequentially stacked on each other along a length L direction of the light emitting element LD.

The light emitting element LD may include a first end portion EP1 and a second end portion EP2. The first semiconductor layer SEC1 may be adjacent to the first end portion EP1 of the light emitting element LD. The second semiconductor layer SEC2 and the electrode layer ELL may be adjacent to the second end portion EP2 of the light emitting element LD.

In accordance with an embodiment, the light emitting element LD may have a pillar shape. The pillar shape may mean a shape extending in the length L direction thereof, such as a cylinder or a polyprism. For example, a length L of the light emitting element LD may be greater than a diameter D (or a width of a cross-section) of the light emitting element LD. The shape of a section of the light emitting element LD may include a rod-like shape or bar-like shape, but the disclosure is not limited thereto.

The light emitting element LD may have a size of nanometer scale to micrometer scale. For example, each of the diameter D (or width) and the length L of the light emitting element LD may have a size of nanometer scale to micrometer scale, but the disclosure is not limited thereto.

The first semiconductor layer SEC1 may be a first conductivity type semiconductor layer. For example, the first semiconductor layer SEC1 may include an N-type semiconductor layer. In accordance with an embodiment, each layer included in the first semiconductor layer SEC1 may include an N-type semiconductor layer. For example, a first conductivity type dopant may be provided in each layer included in the first semiconductor layer SEC1. The first semiconductor layer SEC1 may include at least one semiconductor material among InAlGaN, GaN, AlGaN, InGaN, AlN, and InN, and include an N-type semiconductor layer doped with a first conductivity type dopant such as Si, Ge or Sn. However, the material constituting the first semiconductor layer SEC1 is not limited thereto. The first semiconductor layer SEC1 may be configured with various materials.

The first semiconductor layer SEC1 may include layers. For example, the first semiconductor layer SEC1 may include a highly doped semiconductor layer 120, a defect prevention layer 140, and a strain relief layer 160. However, in some embodiments, the first semiconductor layer SEC1 may not include the strain relief layer 160. The first semiconductor layer SEC1 may have a structure in which the highly doped semiconductor layer 120 and the defect prevention layer 140 may be sequentially stacked on each other.

The highly doped semiconductor layer 120 may be disposed adjacent to the first end portion EP1 of the light emitting element LD. A surface of the highly doped semiconductor layer 120 may be exposed, and another surface of the highly doped semiconductor layer 120 may be in contact with the defect prevention layer 140.

In accordance with an embodiment, the highly doped semiconductor layer 120 may be doped with a first conductivity type dopant (e.g., Si). For example, a concentration (e.g., a first concentration) of the first conductivity type dopant provided in the highly doped semiconductor layer 120 may be higher than that (e.g., a second concentration) of a dopant provided in the defect prevention layer 140. In accordance with an embodiment, the concentration of the first conductivity type dopant provided in the highly doped semiconductor layer 120 may be about $10^{15}$ to about $10^{19}$ per unit area (cm$^3$).

In accordance with an embodiment, the highly doped semiconductor layer 120 may have a porous structure. In an example, an electrochemical etching process may be performed so as to form the porous structure in the highly doped semiconductor layer 120. This will be described in detail later with reference to FIG. 15.

The defect prevention layer 140 may be disposed between the highly doped semiconductor layer 120 and the active layer AL. The defect prevention layer 140 may be disposed between the highly doped semiconductor layer 120 and the strain relief layer 160. A surface of the defect prevention layer 140 may be in contact with the highly doped semiconductor layer 120, and another surface of the defect prevention layer 140 may be in contact with the strain relief layer 160. The defect prevention layer 140 may be disposed adjacent to the highly doped semiconductor layer 120, and accordingly, occurrence of a defect in the highly doped semiconductor layer 120 can be prevented.

In accordance with an embodiment, the defect prevention layer 140 may be doped with a small amount of first conductivity type dopant (e.g., Si). For example, a concentration of the first conductivity type dopant provided in the defect prevention layer 140 may be at least lower than that of the first conductivity type dopant provided in the highly doped semiconductor layer 120. In accordance with another embodiment, the defect prevention layer 140 may not be doped with the first conductivity type dopant. Accordingly, the first semiconductor layer SEC1 may have a structure in which a dopant having a selectively high concentration is provided in a partial layer.

The strain relief layer 160 may be disposed on the defect prevention layer 140. The strain relief layer 160 may be disposed between the defect prevention layer 140 and the active layer AL. A surface of the strain relief layer 160 may be in contact with the defect prevention layer 140, and another surface of the strain relief layer 160 may be in contact with the active layer AL.

The strain relief layer 160 may be formed in a superlattice structure, to relieve (or decrease) strain which may occur in a first half (particularly, the highly doped semiconductor layer 120) of the first semiconductor layer SEC1.

In accordance with an embodiment, the strain relief layer 160 may have a structure in which a first relief layer and a second relief layer different from the first relief layer may be alternately disposed. For example, the first relief layer may be InGaN, and the second relief layer may be GaN. However, the disclosure is not necessarily limited thereto.

In accordance with the disclosure, the defect prevention layer 140 and the strain relief layer 160 may be provided in the light emitting element LD, to reduce the strength of strain in an internal structure while preventing occurrence of a defect. Accordingly, the light emission efficiency of the light emitting element LD can be improved.

In particular, in case that the light emitting element LD is to emit light (e.g., red light) having a high wavelength, In having a high concentration may be provided in the active layer AL so as to form a band gap.

Experimentally, in case that the concentration of In is highly provided, a lattice constant value may increase, and therefore, a lattice mismatch between layers may increase. Accordingly, a larger amount of strain may occur. However, in accordance with an embodiment, occurrence of strain can be reduced even in case that In having a high concentration may be provided. As a result, the light emission efficiency of the light emitting element LD can be improved.

The active layer AL may be disposed on the first semiconductor layer SEC1. The active layer AL may be disposed between the first semiconductor layer SEC1 and the second semiconductor layer SEC2.

The active layer AL may include at least one of AlGaInP, AlGaP, AlInGaN, InGaN, and AlGaN. For example, in case that the active layer AL is to output red light, the active layer AL may include AlGaInP and/or InGaN. In case that the active layer AL is to output green light or blue light, the active layer AL may include InGaN. However, the active layer AL is not limited to the above-described example.

The active layer AL may be formed in a single-quantum well structure or a multi-quantum well structure. In an example, the active layer AL may include a barrier layer and a quantum well layer. In accordance with an embodiment, AlGaN may be provided in the barrier layer, and InGaN may be provided in the quantum well layer. However, the disclosure is not limited thereto.

The second semiconductor layer SEC2 may be formed on the active layer AL, and may include a semiconductor layer having a type different from that of the first semiconductor layer SEC1. For example, the second semiconductor layer SEC2 may include a P-type semiconductor layer. In an example, the second semiconductor layer SEC2 may include at least one semiconductor material among InAlGaN, GaN, AlGaN, InGaN, AlN, and InN, and include a P-type semiconductor layer doped with a second conductivity type dopant such as Mg. However, the material constituting the second semiconductor layer SEC2 is not limited thereto. The second semiconductor layer SEC2 may be configured with various materials.

The electrode layer ELL may be formed on the second semiconductor layer SEC2. The electrode layer ELL may include metal or metal oxide. In an example, the electrode layer ELL may include at least one of Cr, Ti, Al, Au, Ni, ITO, IZO, ITZO, and any oxide or alloy thereof.

In case that a voltage which may be a threshold voltage or more is applied to both ends of the light emitting element LD, electron-hole pairs may be combined in the active layer AL, and the light emitting element LD emits light. The light emission of the light emitting element LD may be controlled by using such a principle, so that the light emitting element LD can be used as a light source for various light emitting devices, including a pixel of a display device (see 'DD' shown in FIG. 7).

The light emitting element LD may further include an insulative film INF provided on a surface thereof. The insulative film INF may be formed with a single film or multiple films.

The insulative film INF may expose both the end portions of the light emitting element LD, which may have different polarities. For example, the insulative film INF may expose a portion of each of the first semiconductor layer SEC1 disposed adjacent to the first end portion EP1 and the electrode layer ELL disposed adjacent to the second end portion EP2.

The insulative film INF may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the insulative film INF is not limited to a specific example.

The insulative film INF may ensure the electrical stability of the light emitting element. The insulative film INF may prevent occurrence of an unwanted short circuit between light emitting elements LD even in case that the light emitting elements LD may be disposed close to each other.

In accordance with an embodiment, the structure of the light emitting element LD is not necessarily limited to the above-described example. In some embodiments, the light emitting element LD may further include an additional electrode layer, an additional active layer, and the like.

The light emitting element LD in accordance with the second embodiment of the disclosure will be described. Descriptions of portions redundant or similar to those described above will be simplified or omitted.

Referring to FIGS. 3 and 4, the light emitting element LD in accordance with the second embodiment of the disclosure may be different from the light emitting element LD in accordance with the first embodiment of the disclosure at least in that the defect prevention layer 140 may be disposed more adjacent to the first end portion EP1 than the highly doped semiconductor layer 120.

In accordance with an embodiment, the defect prevention layer 140 may be disposed adjacent to the first end portion EP1. For example, a surface of the defect prevention layer 140 may be adjacent to the first end portion EP1, and another surface of the defect prevention layer 140 may be in contact with the highly doped semiconductor layer 140.

In accordance with an embodiment, the highly doped semiconductor layer 120 may be disposed between the defect prevention layer 140 and the active layer AL. The highly doped semiconductor layer 120 may be disposed between the defect prevention layer 140 and the strain relief layer 160. A surface of the highly doped semiconductor layer 120 may be in contact with the defect prevention layer 140, and another surface of the highly doped semiconductor layer 120 may be in contact with the strain relief layer 160.

In accordance with an embodiment, the strain relief layer 160 may be disposed between the highly doped semiconductor layer 120 and the active layer AL. A surface of the strain relief layer 160 may be in contact with the highly doped semiconductor layer 120, and another surface of the strain relief layer 160 may be in contact with the active layer AL.

The light emitting element LD in accordance with the second embodiment of the disclosure may not include the strain relief layer 160. The first semiconductor layer SEC1 of the light emitting element LD in accordance with the second embodiment of the disclosure may have a structure including the defect prevention layer 140 adjacent to the first end portion EP1 and the highly doped semiconductor layer 120 disposed on the defect prevention layer 140. A surface of the highly doped semiconductor layer 120 may be in contact with the defect prevention layer 140, and another surface of the highly doped semiconductor layer 120 may be in contact with the active layer AL.

The light emitting element LD in accordance with the third embodiment of the disclosure will be described with reference to FIGS. 5 and 6. Descriptions of portions redundant or similar to those described above will be simplified or omitted.

Referring to FIGS. 5 and 6, the light emitting element LD in accordance with the third embodiment of the disclosure may be different from the light emitting element LD in accordance with the second embodiment of the disclosure at least in that the light emitting element LD in accordance with the third embodiment of the disclosure may further include an adjacent defect prevention layer.

In accordance with an embodiment, the highly doped semiconductor layer 120 may be disposed between the defect prevention layer 140 and the active layer AL. The highly doped semiconductor layer 120 may be disposed between the defect prevention layer 140 and the adjacent defect prevention layer 142. For example, a surface of the highly doped semiconductor layer 120 may be in contact with the defect prevention layer 140, and another surface of the highly doped semiconductor layer 120 may be in contact with the adjacent defect prevention layer 142.

In accordance with an embodiment, a dopant having a concentration (e.g., a third concentration) lower than that (e.g., the first concentration) of the first conductivity type dopant provided in the highly doped semiconductor layer 120 may be provided in the adjacent defect prevention layer 142.

In accordance with an embodiment, the adjacent defect prevention layer 142 may be disposed between the defect prevention layer 140 and the active layer AL. The adjacent defect prevention layer 142 may be disposed between the highly doped semiconductor layer 120 and the active layer AL. The adjacent defect prevention layer 142 may be disposed between the highly doped semiconductor layer 120 and the strain relief layer 160. For example, a surface of the adjacent defect prevention layer 142 may be in contact with the highly doped semiconductor layer 120, and another surface of the adjacent defect prevention layer 142 may be in contact with the strain relief layer 160.

In accordance with an embodiment, the strain relief layer 160 may be disposed between the adjacent defect prevention layer 142 and the active layer AL. A surface of the strain relief layer 160 may be in contact with the adjacent defect prevention layer 142, and another surface of the strain relief layer 160 may be in contact with the active layer AL.

The light emitting element LD in accordance with the third embodiment of the disclosure may not include the strain relief layer 160. The first semiconductor layer SEC1 of the light emitting element LD in accordance with the third embodiment of the disclosure may have a structure including the defect prevention layer 140 adjacent to the first end portion EP1, the highly doped semiconductor layer 120 disposed on the defect prevention layer 140, and the adjacent defect prevention layer 142 disposed on the highly doped semiconductor layer 120. A surface of the adjacent defect prevention layer 142 may be in contact with the highly doped semiconductor layer 120, and another surface of the adjacent defect prevention layer 142 may be in contact with the active layer AL.

Hereinafter, a display device DD including a light emitting element LD in accordance with an embodiment of the disclosure will be described.

Figure 7:
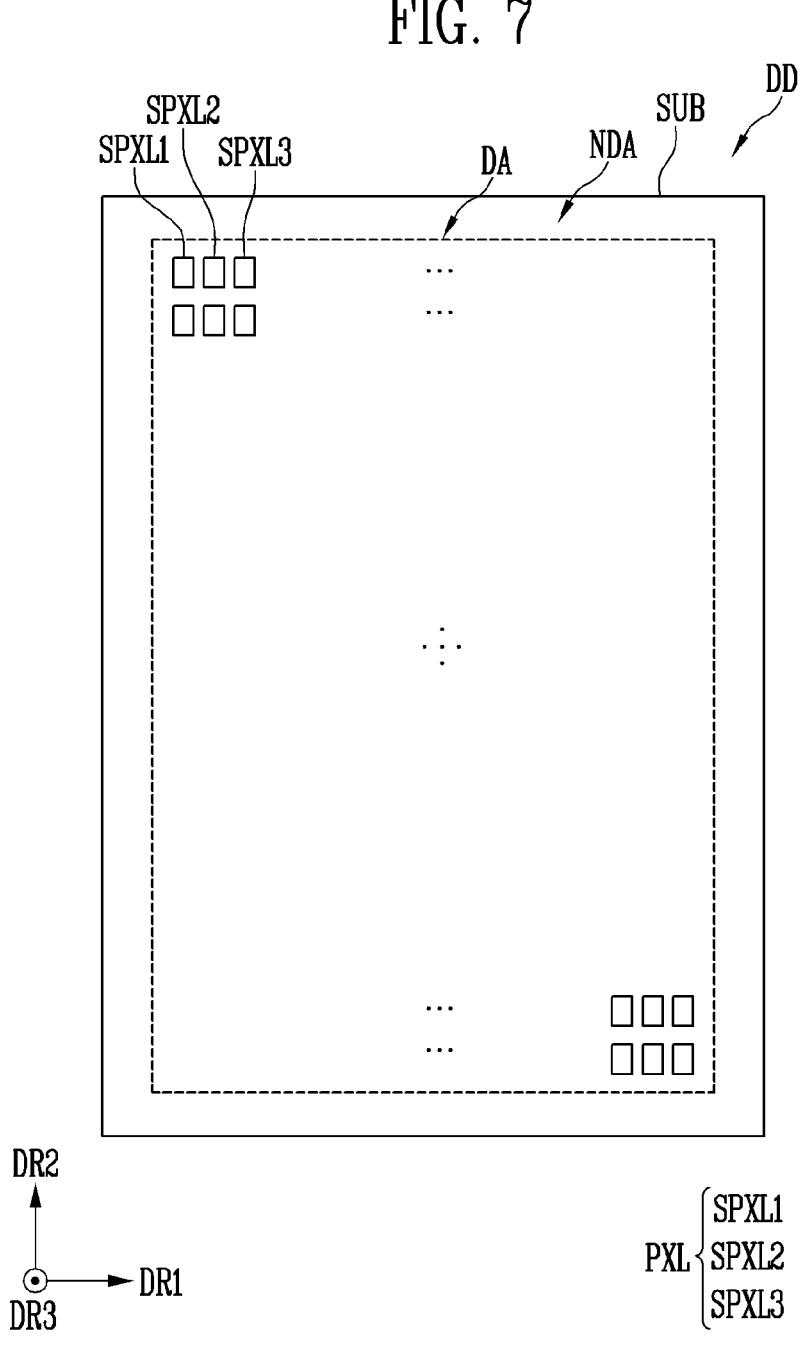
FIG. 7 is a plan view schematically illustrating a display device in accordance with an embodiment of the disclosure.

FIG. 7 is a plan view schematically illustrating a display device in accordance with an embodiment of the disclosure.

The display device DD in accordance with the embodiment of the disclosure may emit light. Referring to FIG. 7, the display device DD may include a substrate SUB and pixels PXL disposed on the substrate SUB. Although not shown in the drawing, the display device DD may further include a driving circuit unit (e.g., a scan driver and a data driver) for driving pixels PXL, lines, and pads.

In an example, each pixel PXL may include a first sub-pixel SPXL1, a second sub-pixel SPXL2, and a third sub-pixel SPXL3.

The display device DD may include a display area DA and a non-display area NDA. The non-display area NDA may mean an area except the display area DA. The non-display area NDA may surround at least a portion of the display area DA.

The substrate SUB may constitute a base member of the display device DD. The substrate SUB may be a rigid or flexible substrate or film. However, the substrate SUB is not limited to a specific example.

The display area DA may mean an area in which pixels PXL may be disposed. The non-display area NDA may mean an area in which pixels PXL may not be disposed. A driving circuit unit, lines, and pads, which may be connected to the pixel PXL of the display area DA, may be disposed in the non-display area NDA.

In an example, the pixels PXL may be arranged according to a stripe arrangement structure, a PenTile® arrangement structure, or the like. However, the disclosure is not limited thereto, and various embodiments may be applied.

In accordance with an embodiment, the pixel PXL including multiple sub-pixels (see 'SPXL' shown in FIG. 9) may be disposed in the display area DA. For example, a first sub-pixel SPXL1 emitting light of a first color, a second sub-pixel SPXL2 emitting light of a second color, and a third sub-pixel SPXL3 emitting light of a third color may be arranged in the display area DA, and at least one first sub-pixel SPXL1, at least one second sub-pixel SPXL2, and at least one third sub-pixel SPXL3 may constitute one pixel unit capable of emitting lights of various colors.

For example, each of the first to third sub-pixels SPXL1, SPXL2, and SPXL3 may be a sub-pixel emitting light of a color. In an example, the first sub-pixel SPXL1 may be a red pixel emitting light of red (e.g., the first color), the second sub-pixel SPXL2 may be a green pixel emitting light of green (e.g., the second color), and the third sub-pixel SPXL3 may be a blue pixel emitting light of blue (e.g., the third color). However, the color, kind, and/or number of pixels PXL constituting each pixel unit are not limited to a specific example.

Hereinafter, for convenience of description, an embodiment in which the pixel PXL includes the first to third sub-pixels SPXL1, SPXL2, and SPXL3 will be described. A sub-pixel (see 'SPXL' shown in FIG. 8) defined in this specification may be any one of the first to third sub-pixels SPXL1, SPXL2, and SPXL3.

Figure 8:
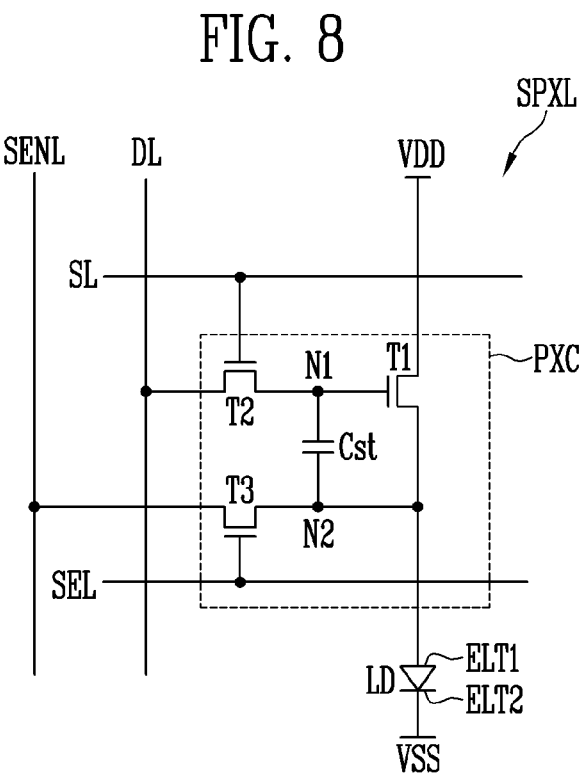
FIG. 8 is a circuit diagram schematically illustrating a pixel circuit included in a pixel in accordance with an embodiment of the disclosure.

FIG. 8 is a circuit diagram schematically illustrating a pixel circuit included in a pixel in accordance with an embodiment of the disclosure.

FIG. 8 illustrates an electrical connection relationship between components included in a sub-pixel SPXL applied to an active type display device DD according to an embodiment. However, the kinds of the components included in a sub-pixel SPXL are not limited thereto.

Referring to FIG. 8, the sub-pixel SPXL may include a light emitting element LD and a pixel circuit PXC.

The light emitting element LD may be connected between a first power line VDD and a second power line VSS. An end portion (e.g., a P-type semiconductor) of the light emitting element LD may be connected to the first power line VDD via a first electrode ELT1 and the pixel circuit PXC, and another end portion (e.g., an N-type semiconductor) of the light emitting element LD may be connected to the second power line VSS via a second electrode ELT2.

In accordance with an embodiment, in case that a driving current is supplied through the pixel circuit PXC, the light emitting element LD may emit light with a luminance corresponding to the driving current.

In accordance with an embodiment, light emitting elements LD may be connected to each other through various connection structures between the first power line VDD and the second power line VSS. In an example, the light emitting elements LD may be connected only in parallel to each other or be connected only in series to each other. In other embodiments, the light emitting elements LD may be connected in a series/parallel hybrid structure.

The first power line VDD and the second power line VSS may have different potentials such that the light emitting elements LD emit light. The first power line VDD and the second power line VSS may have a potential difference to a degree to which light can be emitted during an emission period of the sub-pixel SPXL. For example, the first power line VDD may be set to have a potential higher than that of the second power line VSS.

The pixel circuit PXC may connect between the first power line VDD and the light emitting element LD. The pixel circuit PXC may include a first transistor T1, a second transistor T2, a third transistor T3, and a storage capacitor Cst.

In accordance with an embodiment, an electrode of the first transistor T1 may be connected to the first power line VDD, and another electrode of the first transistor T1 may be connected to an electrode (e.g., an anode electrode) of the light emitting element LD. A gate electrode of the first transistor T1 may be connected to a first node N1. The first transistor T1 may control a current flowing through the light emitting element LD, corresponding to a voltage applied through the first node N1.

In accordance with an embodiment, an electrode of the second transistor T2 may be connected to a data line DL, and another electrode of the second transistor T2 may be connected to the first node N1. A gate electrode of the second transistor T2 may be connected to a scan line SL. The second transistor T2 may be turned on in case that a scan signal is supplied from the scan line SL, and transfer a data signal provided from the data line DL to the first node N1.

In accordance with an embodiment, an electrode of the third transistor T3 may be connected to a sensing line SENL, and another electrode of the third transistor T3 may be connected to a second node N2. A gate electrode of the third transistor T3 may be connected to a sensing signal line SEL. In case that the third transistor T3 is turned on in response to a sensing signal provided from the sensing signal line SEL, a reference voltage may be provided to the second node N2 through the sensing line SENL.

In accordance with an embodiment, the reference voltage may function to set or initialize, to a constant value, a voltage of an electrode of the first transistor T1 (e.g., a source electrode of the first transistor T1), which may be connected to the light emitting element LD. In an example, the reference voltage may be set smaller than or equal to a voltage of the second power line VSS.

In accordance with an embodiment, in case that the third transistor T3 is turned on in response to the sensing signal provided from the sensing signal line SEL, the third transistor T3 may transfer a sensing current to the sensing line SENL.

In accordance with an embodiment, the sensing current may be used to calculate a mobility of the first transistor T1 and a variation in threshold voltage.

The storage capacitor Cst may be connected between the first node N1 (or the gate electrode of the first transistor T1) and the second node N2 (or the another electrode of the first transistor T1. The storage capacitor Cst may store information on a difference between the voltage of the first node N1 and a voltage of the second node N2.

The structure of the pixel circuit PXC is not limited to that shown in FIG. 8, and various types of structure may be implemented. Although a case where the first to third transistors T1 to T3 may be implemented with an N-type transistor has been illustrated in FIG. 8, the disclosure is not limited thereto. In some embodiments, the first to third transistors T1 to T3 may be implemented with a P-type transistor.

Hereinafter, the structure of the sub-pixels SPXL constituting the pixel PXL will be described in more detail with reference to FIGS. 9 to 13. Descriptions of portions redundant or similar to those described above will be simplified or omitted.

Figure 9:
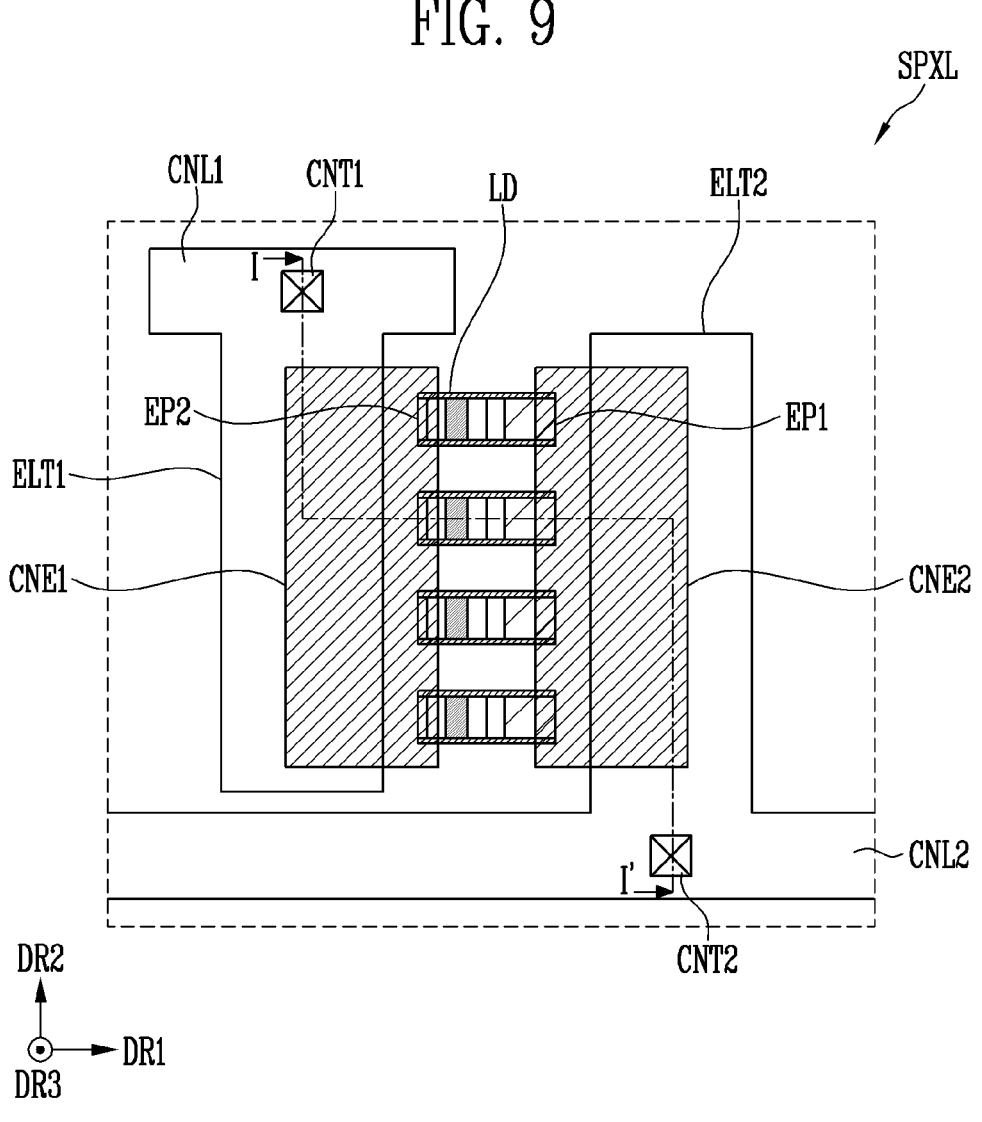
FIG. 9 is a plan view schematically illustrating a sub-pixel in accordance with an embodiment of the disclosure.

FIG. 9 is a plan view schematically illustrating a sub-pixel in accordance with an embodiment of the disclosure. The sub-pixel SPXL shown in FIG. 9 may be at least one of the first to third sub-pixels SPXL1, SPXL2, and SPXL3.

Referring to FIG. 9, the sub-pixel SPXL may include a first electrode ELT1, a second electrode ELT2, a first connection electrode CNL1, a second connection electrode CNL2, a first contact part CNT1, a second contact part CNT2, a light emitting element LD, a first contact electrode CNE1, and a second contact electrode CNE2.

A plurality of light emitting elements LD may be provided and arranged (disposed). In an example, the light emitting elements LD may be arranged in a parallel structure along a second direction DR2. However, the arrangement structure of the light emitting elements LD is not limited thereto.

A light emitting element LD may be disposed between electrodes that serve as alignment electrodes.

For example, a light emitting element LD may be disposed between the first electrode ELT1 and the second electrode ELT2, in a plan view. The light emitting element LD may be disposed on the first electrode ELT1 and the second electrode ELT2. At least a portion of the light emitting element LD may be disposed between the first electrode ELT1 and the second electrode ELT2, in a plan view.

The light emitting element LD may be electrically connected to the first electrode ELT1 through the first contact electrode CNE1.

In accordance with an embodiment, a second end portion EP2 may be electrically connected to the first contact electrode CNE1. Accordingly, a second semiconductor layer SEC2 of the light emitting element LD may be electrically connected to the first electrode ELT1 and the first contact electrode CNE1.

The light emitting element LD may be electrically connected to the second electrode ELT2 through the second contact electrode CNE2.

In accordance with an embodiment, a first end portion EP1 of the light emitting element LD may be electrically connected to the second contact electrode CNE2. Accordingly, a first semiconductor layer SEC1 of the light emitting element LD may be electrically connected to the second electrode ELT2 and the second contact electrode CNE2.

The first electrode ELT1 may extend in the second direction DR2. The first electrode ELT1 may be spaced apart from the second electrode ELT2 in a first direction DR1. The first electrode ELT1 may be connected to the first connection electrode CNL1. The first direction DR1 may intersect (or be non-parallel to) the second direction DR2.

The first connection electrode CNL1 may be a bridge pattern (see 'BRP' shown in FIG. 10) included in a pixel circuit part (see 'PCL' shown in FIG. 10) through the first contact part CNT1. The first connection electrode CNL1 may be disposed in the same layer as the first electrode ELT1, to be integrally formed with each other.

The second electrode ELT2 may extend in the second direction DR2. The second electrode ELT2 may be spaced apart from the first electrode ELT1 in the first direction DR1. The second electrode ELT2 may be connected to the second connection electrode CNL2.

The second connection electrode CNL2 may be connected to a power line (see TV shown in FIG. 10) included in the pixel circuit part PCL through the second contact part CNT2. The second connection electrode CNL2 may be disposed in the same layer as the second electrode ELT2, to be integrally formed with each other.

The first contact electrode CNE1 may be disposed on the first electrode ELT1, to be electrically connected to the first electrode ELT1. The first contact electrode CNE1 may electrically connect the first electrode ELT1 and the light emitting element LD to each other.

The second contact electrode CNE2 may be disposed on the second electrode ELT2, to be electrically connected to the second electrode ELT2. The second contact electrode CNE2 may electrically connect the second electrode ELT2 and the light emitting element LD to each other.

In accordance with an embodiment, the first contact electrode CNE1 may overlap the second end portion EP2 of the light emitting element LD in a plan view, and the second contact electrode CNE2 may overlap the first end portion EP1 of the light emitting element LD in a plan view. The first contact electrode CNE1 may cover (overlap) the second end portion EP2 of the light emitting element LD, and the second contact electrode CNE2 may cover the first end portion EP1 of the light emitting element LD.

Hereinafter, a sectional structure of the sub-pixel SPXL in accordance with an embodiment of the disclosure will be described with reference to FIG. 10.

Figure 10:
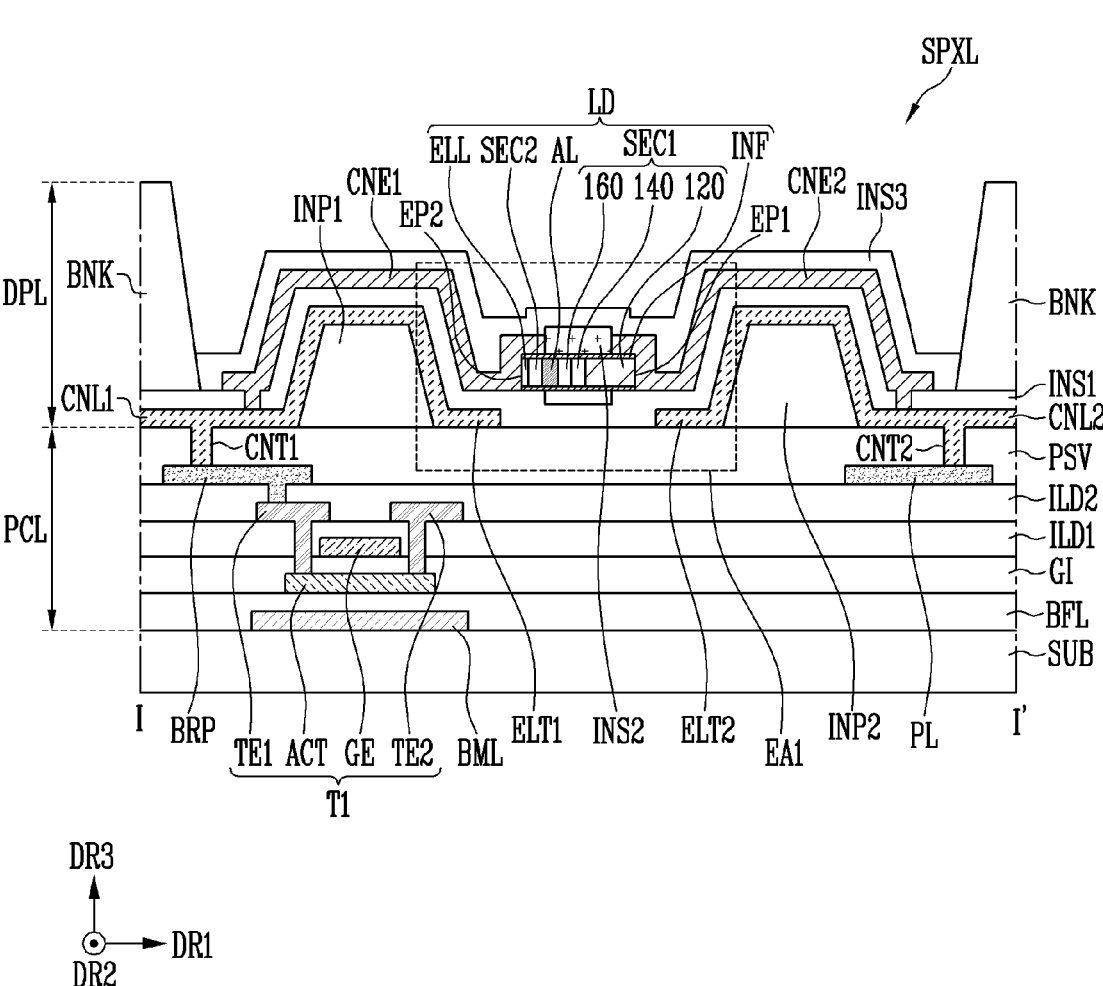
FIG. 10 is a schematic sectional view taken along line I-I' shown in FIG. 9.

FIG. 10 is a schematic view illustrating a section of the sub-pixel SPXL in accordance with an embodiment of the disclosure. FIG. 10 is a schematic sectional view taken along line I-I' shown in FIG. 9.

Referring to FIG. 10, a pixel PXL may include a substrate SUB, a pixel circuit part PCL, and a display element part DPL. Hereinafter, for convenience of description, the first transistor among the first to third transistors T1 to T3 described above will be described.

The substrate SUB may constitute a base member of the display device DD. The substrate SUB may be a rigid or flexible substrate or film. However, the substrate SUB is not limited to a specific example. In an example, the substrate SUB may include polyimide. The substrate SUB may be provided as a base surface such that the pixel circuit part PCL and the display element part DPL may be disposed on the substrate SUB.

The pixel circuit part PCL may be disposed on the substrate SUB. The pixel circuit part PCL may include a bottom electrode layer BML, a buffer layer BFL, a first transistor T1, a gate electrode layer GI, a first interlayer insulating layer ILD1, a second interlayer insulating layer ILD2, a bridge pattern BRP, a power line PL, a protective layer PSV, a first contact part CNT1, and a second contact part CNT2.

The bottom electrode layer BML may be disposed on the substrate SUB, to be covered by the buffer layer BFL. A portion of the bottom electrode layer BML may overlap the first transistor T1 in a plan view.

In accordance with an embodiment, the bottom electrode layer BML may include a conductive material, thereby serving as a path through which an electrical signal provided to the pixel circuit part PCL and the display element part DPL may move. In an example, the bottom electrode layer BML may include at least one of aluminum (Al), copper (Cu), titanium (Ti), and molybdenum (Mo).

The buffer layer BFL may be disposed on the substrate SUB. The buffer layer BFL may prevent an impurity from being diffused from the outside. The buffer layer BFL may include at least one of silicon nitride (SiN$_x$), silicon oxide (SiO$_x$), silicon oxynitride (SiO$_x$N$_y$), and metal oxide such as aluminum oxide (AlO$_x$).

The first transistor T1 may be a thin film transistor. In accordance with an embodiment, the first transistor T1 may be a driving transistor.

The first transistor T1 may be electrically connected to a light emitting element LD. The first transistor T1 may be electrically connected to the bridge pattern BRP. However, the first transistor T1 is not limited to the above-described example. In an example, the first transistor T1 does not pass through the bridge pattern BRP, but may be electrically connected to a first connection electrode CNL1.

The first transistor T1 may include an active layer ACT, a first transistor electrode TE1, a second transistor electrode TE2, and a gate electrode GE.

The active pattern ACT may mean a semiconductor layer. The active layer ACT may be disposed on the buffer layer BFL. For example, the active layer ACT may include at least one of poly-silicon, Low Temperature Polycrystalline Silicon (LTPS), amorphous silicon, and an oxide semiconductor.

The active pattern ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active pattern ACT. For example, the gate electrode GE may be disposed on the channel region of the active pattern ACT with the gate insulating layer GI interposed therebetween. In an example, the gate electrode GE may include at least one of aluminum (Al), copper (Cu), titanium (Ti), and molybdenum (Mo).

The gate insulating layer GI may be disposed over the active pattern ACT. The gate insulating layer GI may include an inorganic material. In an example, the gate insulating layer GI may include at least one of silicon nitride (SiN$_x$), silicon oxide (SiO$_x$), silicon oxynitride (SiO$_x$N$_y$), and aluminum oxide (AlO$_x$).

The first interlayer insulating layer ILD1 may be located over the gate electrode GE. Like the gate insulating layer GI, the first interlayer insulating layer ILD1 may include at least one of silicon nitride (SiN$_x$), silicon oxide (SiO$_x$), silicon oxynitride (SiO$_x$N$_y$), and aluminum oxide (AlO$_x$).

The first transistor electrode TE1 and the second transistor electrode TE2 may be located on the first interlayer insulating layer ILD1. The first transistor electrode TE1 may be in contact with the first contact region of the active pattern ACT while penetrating the gate insulating layer GI and the first interlayer insulating layer ILD1, and the second transistor electrode TE2 may be in contact with the second contact region of the active pattern ACT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The second interlayer insulating layer ILD2 may be located over the first transistor electrode TE1 and the second transistor electrode TE2. Like the first interlayer insulating layer ILD1 and the gate insulating layer GI, the second interlayer insulating layer ILD2 may include an inorganic material. The inorganic material may include at least one of the materials described as an example of the material constituting the first interlayer insulating layer ILD1 and the gate insulating layer GI, e.g., silicon nitride (SiN$_x$), silicon oxide (SiO$_x$), silicon oxynitride (SiO$_x$N$_y$), and aluminum oxide (AlO$_x$).

The bridge pattern BRP may be disposed on the second interlayer insulating layer ILD2. The bridge pattern BRP may be connected to the first transistor electrode TE1 through a contact hole penetrating the second interlayer insulating layer ILD2. The bridge pattern BRP may be electrically connected to the first connection electrode CNL1 through the first contact part CNT1 formed in the protective layer PSV.

The power line PL may be disposed on the second interlayer insulating layer ILD2. The power line PL may be electrically connected to a second connection electrode CNL2 through the second contact part CNT2 formed in the protective layer PSV. The power line PL may provide a power source (or cathode signal) to the light emitting element LD through a second electrode ELT2.

The protective layer PSV may be located on the second interlayer insulating layer ILD2. The protective layer PSV may cover the bridge pattern BRP and the power line PL. The protective layer PSV may be a via layer.

In accordance with an embodiment, the protective layer PSV may be provided in a form including an organic insulating layer, an inorganic insulating layer, or the organic insulating layer disposed on the inorganic insulating layer, but the disclosure is not limited thereto.

In accordance with an embodiment, the first contact part CNT1 connected to an area of the bridge pattern BRP and the second contact part CNT2 connected to an area of the power line PL may be formed in the protective layer PSV.

The display element part DPL may be disposed on the pixel circuit part PCL. The display element part DPL may include a first insulating pattern INP1, a second insulating pattern INP2, a bank BNK, the first connection electrode CNL1, the second connection electrode CNL2, a first electrode ELT1, the second electrode ELT2, a first insulating layer INS1, the light emitting element LD, a second insulating layer INS2, a first contact electrode CNE1, a second contact electrode CNE2, and a third insulating layer INS3.

The first insulating pattern INP1 and the second insulating pattern INP2 may be disposed on the protective layer PSV. The first insulating pattern INP1 and the second insulating pattern INP2 may have a shape protruding in a display direction (e.g., a third direction DR3) of the display device DD. In accordance with an embodiment, the first insulating pattern INP1 and the second insulating pattern INP2 may include an organic material or an inorganic material, but the disclosure is not limited thereto.

The first connection electrode CNL1 and the second connection electrode CNL2 may be disposed on the protective layer PSV. The first connection electrode CNL1 may be connected to the first electrode ELT1. The first connection electrode CNL1 may be electrically connected to the bridge pattern BRP through the first contact part CNT1. The first connection electrode CNL1 may electrically connect the bridge pattern BRP and the first electrode ELT1 to each other. The second connection electrode CNL2 may be connected to the second electrode ELT2. The second connection electrode CNL2 may be electrically connected to the power line PL through the second contact part CNT2. The second connection electrode CNL2 may electrically connect the power line PL and the second electrode ELT2 to each other.

The first electrode ELT1 and the second electrode ELT2 may be disposed on the protective layer PSV. In accordance with an embodiment, at least a portion of the first electrode ELT1 may be arranged on the first insulating pattern INP1, and at least a portion of the second electrode ELT2 may be arranged on the second insulating pattern INP2. Therefore, each of the first electrode ELT1 and the second electrode ELT2 may serve as a reflective partition wall or bank.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may provide an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. In an example, the first electrode ELT1 and the second electrode ELT2 may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or any alloy thereof. However, the first electrode ELT1 and the second electrode ELT2 are not limited to the above-described example.

In accordance with an embodiment, the first electrode ELT1 and the second electrode ELT2 may serve as alignment electrodes of the light emitting element LD. For example, the light emitting element LD may be arranged based on an electrical signal provided from the first electrode ELT1 and the second electrode ELT2.

The first insulating layer INS1 may be disposed on the protective layer PSV. The first insulating layer INS1 may cover the first electrode ELT1 and the second electrode ELT2. The first insulating layer INS1 may stabilize connection between electrode components, and reduce external influence. The first insulating layer INS1 may include at least one of silicon nitride ($SiN_x$), silicon oxide ($SiO_x$), silicon oxynitride ($SiO_xN_y$), and aluminum oxide ($AlO_x$).

The bank BNK may be disposed on the first insulating layer INS1. The light emitting element LD may be disposed between banks BNK. The bank BNK may have a shape protruding in the display direction (e.g., the third direction DR3) of the display device DD. In an example, the bank BNK may include an organic material or an inorganic material, but the disclosure is not limited thereto.

The light emitting element LD may be disposed on the first insulating layer INS1, to emit light, based on an electrical signal provided from the first contact electrode CNE1 and the second contact electrode CNE2.

The light emitting element LD may include a first end portion EP1 and a second end portion EP2 as described with reference to FIGS. 1 to 6.

In accordance with an embodiment, the first end portion EP1 of the light emitting element LD may be disposed to face the second electrode ELT2 and the second contact electrode CNE2, and the second end portion EP2 of the light emitting element LD may be disposed to face the first electrode ELT1 and the first contact electrode CNE1.

Accordingly, a first semiconductor layer SEC1 of the light emitting element LD may be adjacent to the second electrode ELT2 and the second contact electrode CNE2, and a second semiconductor layer SEC2 of the light emitting element LD may be adjacent to the first electrode ELT1 and the first contact electrode CNE1.

The second insulating layer INS2 may be disposed on the light emitting element LD. The second insulating layer INS2 may cover an active layer AL of the light emitting element LD. In an example, the second insulating layer INS2 may include at least one of an organic material and an inorganic material. In accordance with an embodiment, at least a portion of the second insulating layer INS2 may fill a gap (or cavity) formed at the bottom of the light emitting element LD.

The first contact electrode CNE1 and the second contact electrode CNE2 may be disposed on the first insulating layer INS1. The first contact electrodes CNE1 may electrically connect the first electrode ELT1 and the light emitting element LD to each other, and the second contact electrode CNE2 may electrically connect the second electrode ELT2 and the light emitting element LD to each other.

In accordance with an embodiment, the first contact electrode CNE1 may provide an anode signal to the light emitting element LD, and the second contact electrode CNE2 may provide a cathode signal to the light emitting element LD.

The first contact electrode CNE1 and the second contact electrode CNE2 may include a conductive material. In accordance with an embodiment, the first contact electrode CNE1 and the second contact electrode CNE2 may be formed through the same process, to include the same material. In an example, the first contact electrode CNE1 and the second contact electrode CNE2 may include a transparent conductive material including Indium Tin Oxide (ITO), Indium Zinc Oxide (IZO), Indium Tin Zinc Oxide (ITZO), or a combination thereof, but the disclosure is not limited thereto.

The third insulating layer INS3 may be disposed over the first contact electrode CNE1, the second contact electrode CNE2, and the second insulating layer INS2, to protect components of the display element part DPL from external influence (e.g., moisture, and the like). In an example, the third insulating layer INS3 may include at least one of silicon nitride ($SiN_x$), silicon oxide ($SiO_x$), silicon oxynitride ($SiO_xN_y$), and aluminum oxide ($AlO_x$).

The structure of the pixel PXL is not limited to the example described above with reference to FIGS. 9 and 10, and various modified embodiments will be implemented.

Hereinafter, layers disposed on a display element part DPL of a pixel in accordance with an embodiment of the disclosure will be described with reference to FIGS. 11 to 13.

Figure 11:
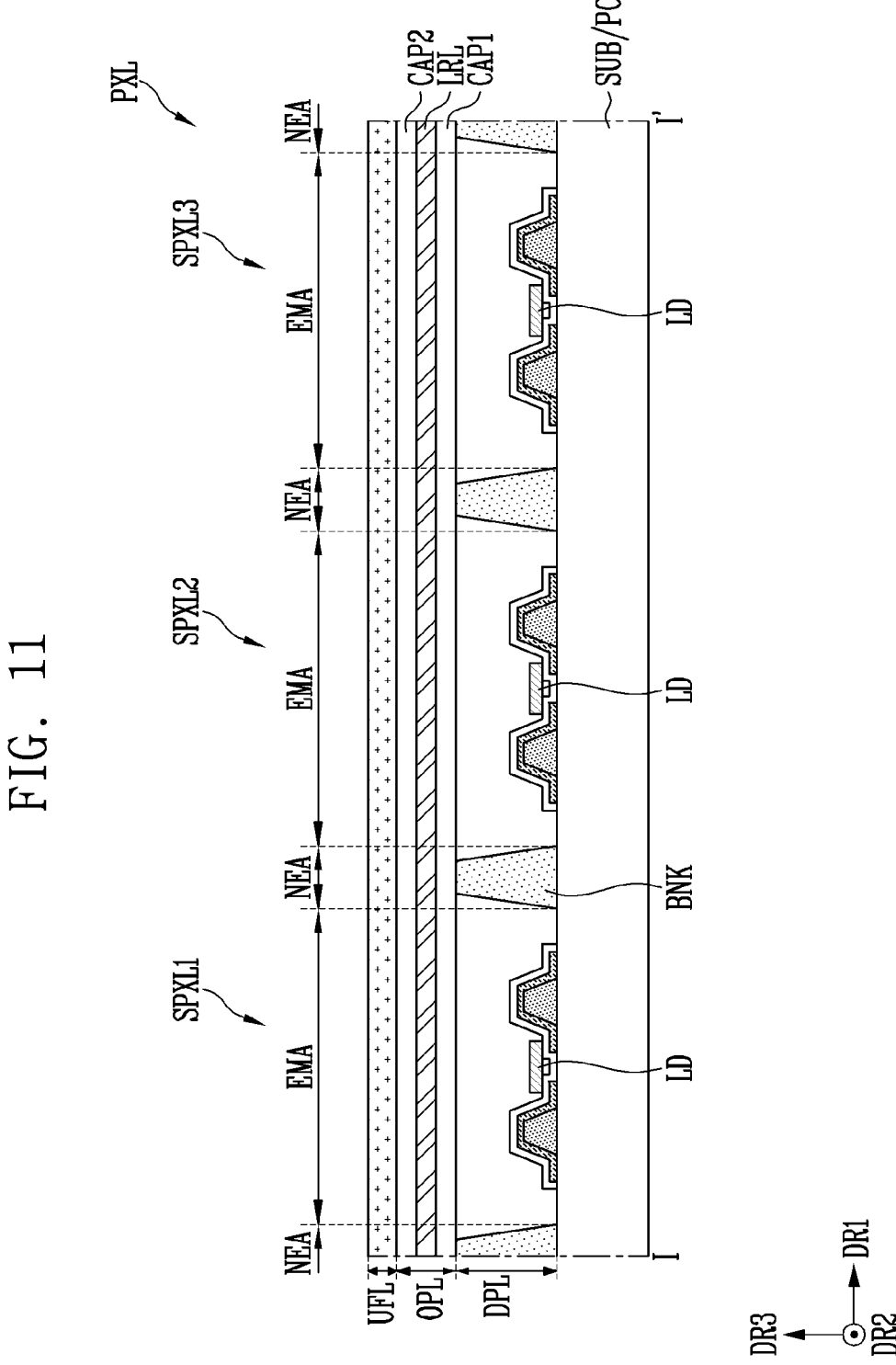
FIGS. 11 to 13 are schematic sectional views of a pixel in accordance with an embodiment of the disclosure.
Figure 12:
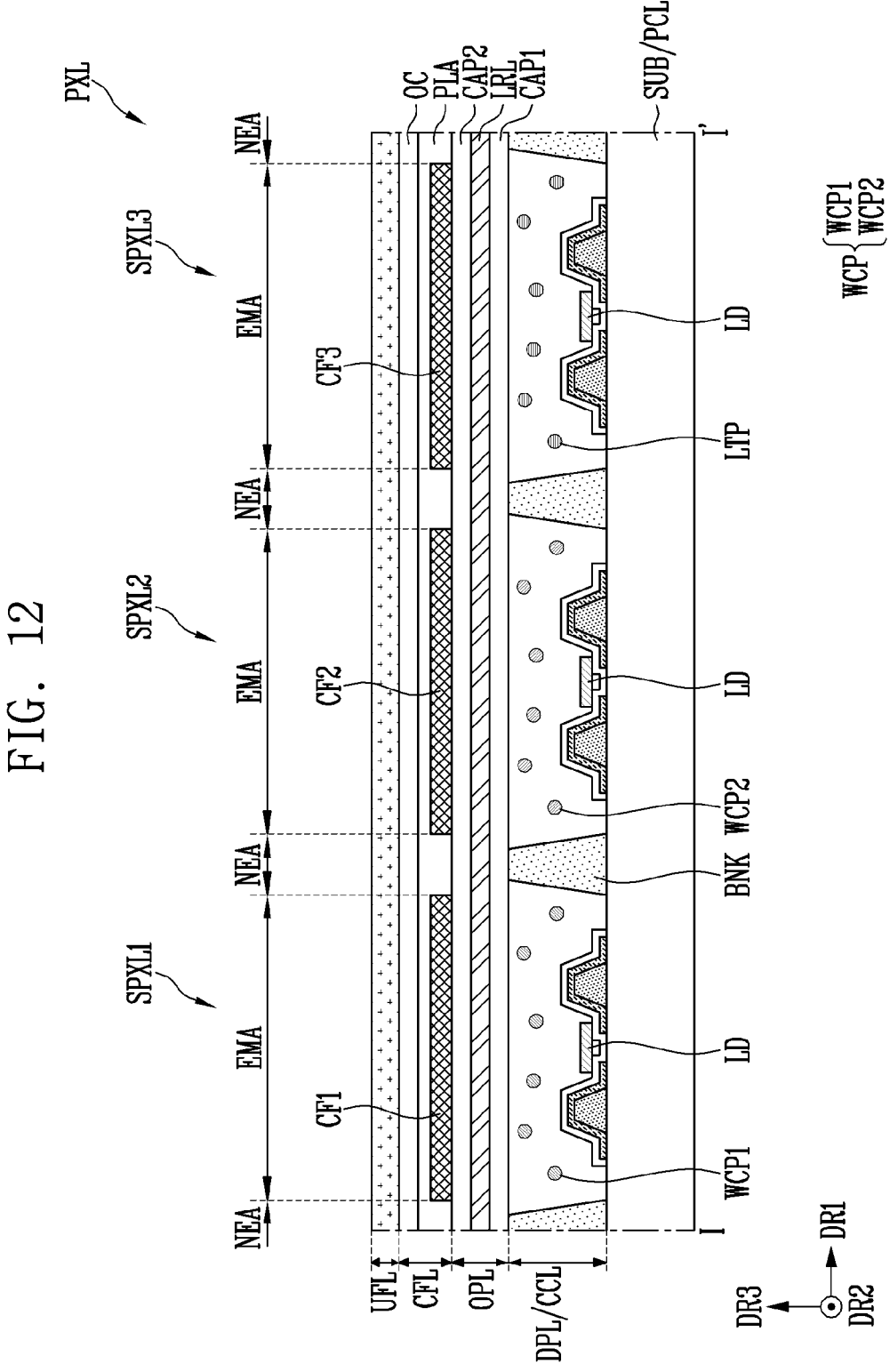
Figure 13:
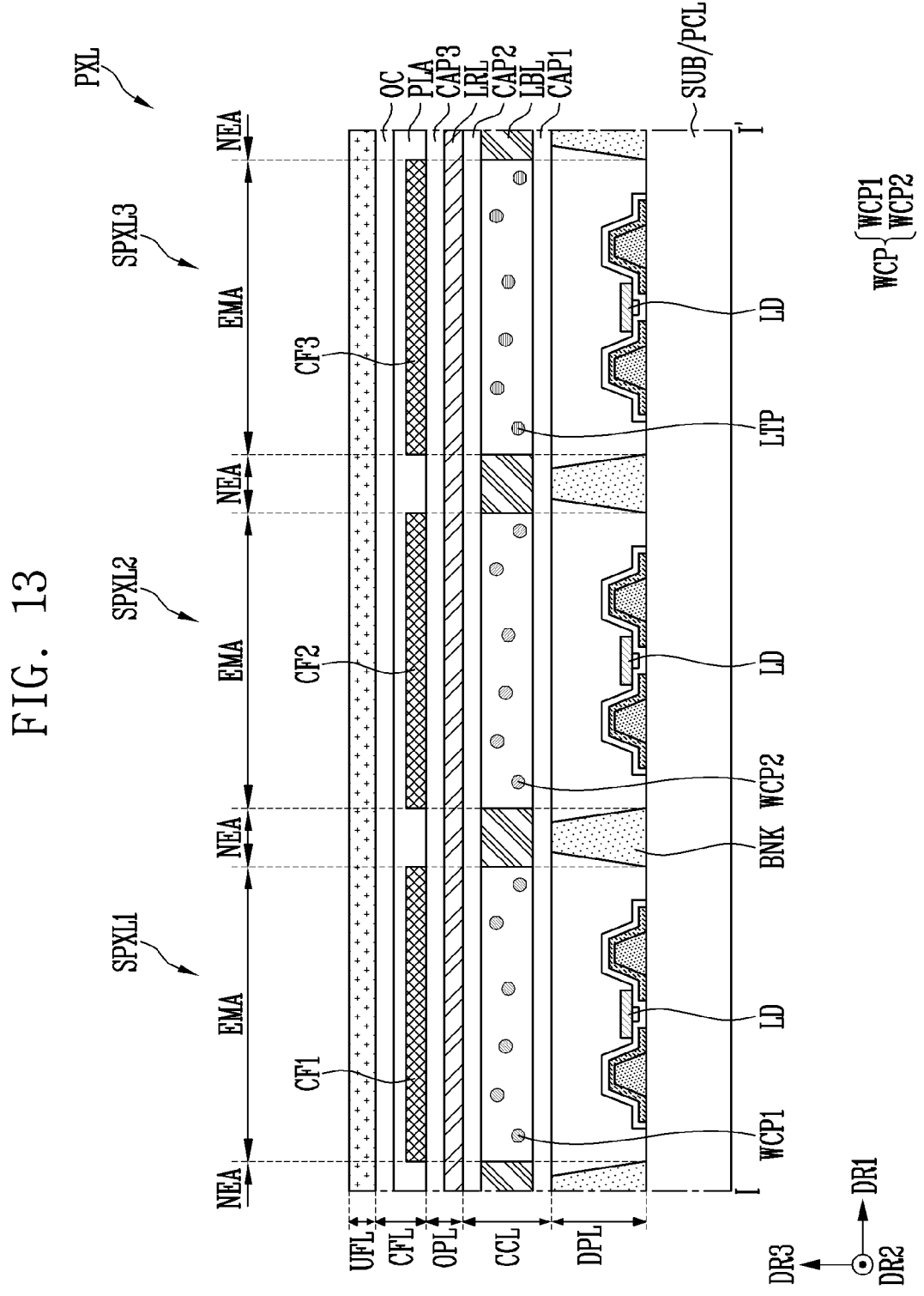

FIGS. 11 to 13 are schematic sectional views of a pixel in accordance with an embodiment of the disclosure. For convenience of description, individual components of a display element DPL are briefly illustrated in FIGS. 11 to 13.

FIG. 11 is a view illustrating a sectional structure of a pixel PXL in accordance with a first embodiment of the disclosure. FIG. 12 is a view illustrating a sectional structure of a pixel PXL in accordance with a second embodiment of the disclosure. FIG. 13 is a view illustrating a sectional structure of a pixel PXL in accordance with a third embodiment of the disclosure.

First, the sectional structure of the pixel PXL in accordance with the first embodiment of the disclosure will be described with reference to FIG. 11.

In accordance with an embodiment, a bank BNK may define an emission area EMA and a non-emission area NEA of the pixel PXL. The bank BNK may have a shape surrounding the emission area EMA. For example, an area in which the bank BNK may be disposed may be defined as the non-emission area NEA, and an area in which the bank BNK may not be disposed may be defined as the emission area EMA.

In accordance with an embodiment, a light emitting element LD included in a first sub-pixel SPXL1, a light emitting element LD included in a second sub-pixel SPXL2, and a light emitting element LD included in a third sub-pixel SPXL3 may emit lights of different colors. For example, the light emitting element LD included in the first sub-pixel SPXL1 may emit light of a first color (e.g., red). The light emitting element LD included in the second sub-pixel SPXL2 may emit light of a second color (e.g., green). The light emitting element LD included in the third sub-pixel SPXL3 may emit light of a third color (e.g., blue). Accordingly, the first to third sub-pixels SPXL1, SPXL2, and SPXL3 may form one pixel PXL.

In accordance with an embodiment, an optical layer OPL may be disposed on the display element part DPL. The optical layer OPL may be disposed between the display element part DPL and an upper film part UFL.

The optical layer OPL may be a layer for improving the light efficiency of the pixel PXL. The optical layer OPL may include a first capping layer CAP1, a low refractive layer LRL, and a second capping layer CAP2.

The first capping layer CAP1 may be disposed on the display element part DPL. The first capping layer CAP1 may encapsulate an area in which light emitting elements LD disposed between banks BNK may be disposed. The first capping layer CAP1 may be provided throughout the first to third sub-pixels SPXL1, SPXL2, and SPXL3. The first capping layer CAP1 may prevent an impurity such as moisture or air from infiltrating from the outside.

In accordance with an embodiment, the first capping layer CAP1 may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The low refractive layer LRL may be disposed between the first capping layer CAP1 and the second capping layer CAP2. The low refractive layer LRL may be provided throughout the first to third sub-pixels SPXL1, SPXL2, and SPXL3.

The low refractive layer LRL may function to allow light provided from the display element part DPL to be recycled by total reflection, thereby improving light efficiency. To this end, the low refractive layer LRL may have a refractive index relatively lower than that of the display element part DPL.

In accordance with an embodiment, the low refractive layer LRL may include a base resin and hollow particles dispersed in the base resin. The hollow particle may include a hollow silica particle. In other embodiments, the hollow particle may be a pore formed by porogen, but the disclosure is not necessarily limited thereto. Also, the low refractive layer LRL may include at least one of a zinc oxide (ZnO) particle, a titanium dioxide ($TiO_2$) particle, and a nano silicate particle, but the disclosure is not necessarily limited thereto.

The second capping layer CAP2 may be disposed on the low refractive layer LRL. The second capping layer CAP2 may be disposed between the upper film part UFL and the low refractive layer LRL. The second capping layer CAP2 may be provided throughout the first to third sub-pixels SPXL1, SPXL2, and SPXL3. The second capping layer CAP2 may prevent the low refractive layer LRL from being damaged or contaminated due to infiltration of an impurity such as moisture or air from the outside.

In accordance with an embodiment, the second capping layer CAP2 may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The upper film part UFL may be disposed on the optical layer OPL. The upper film part UFL may be disposed at an outer portion of the display device DD to decrease external influence on the display device DD. The upper film part UFL may be provided throughout the first to third sub-pixels SPXL1, SPXL2, and SPXL3.

In accordance with an embodiment, the upper film part UFL may include a light transmission film. In an example, the light transmission film may be at least one of a polyethylenephthalate (PET) film, a low reflective film, a polarizing film, and a transmittance controllable film, but the disclosure is not necessarily limited thereto.

In accordance with an embodiment, the upper film part UFL may include an anti-reflective (AR) coating for decreasing reflexibility of light incident from the outside. The AR coating may mean a component formed by coating a material having an anti-reflection function on a surface of a specific component. The coated material may have a low reflexibility. In an example, the material used for the AR coating may include at least one of silicon oxide ($SiO_x$), zirconium oxide ($ZiO_x$), aluminum oxide ($Al_xO_y$), and titanium oxide ($TiO_x$). However, the disclosure is not limited thereto, and various materials may be applied.

The sectional structure of the pixel PXL in accordance with the second embodiment of the disclosure will be described with reference to FIG. 12. Descriptions of portions redundant or similar to those described above will be simplified or omitted.

Referring to FIG. 12, the pixel PXL in accordance with the second embodiment of the disclosure may be different from the pixel PXL in accordance with the first embodiment of the disclosure at least in that the pixel PXL in accordance with the second embodiment of the disclosure may further include a color conversion part CCL and a color filter part CFL.

In accordance with an embodiment, light emitting elements LD disposed in each of first to third sub-pixels SPXL1, SPXL2, and SPXL3 may emit light of the same color. For example, the light emitting elements LD disposed in each of the first to third sub-pixels SPXL1, SPXL2, and SPXL3 may emit blue light. In accordance with an embodiment, the color conversion part CCL and the color filter part CFL may be provided in the pixel PXL, so that a full-color image can be displayed.

In accordance with an embodiment, the color conversion part CCL may be disposed in the same layer as the display element part DPL. In an example, at least a portion of the color conversion part CCL may be disposed between banks BNK.

The color conversion part CCL may include a wavelength conversion pattern WCP and a light transmission pattern LTP. The wavelength conversion pattern WCP may include a first wavelength conversion pattern WCP1 and a second wavelength conversion pattern WCP2.

The first wavelength conversion pattern WCP1 may be disposed to overlap an emission area EMA of the first sub-pixel SPXL1. For example, the first wavelength conversion pattern WCP1 may be provided between banks BNK, to overlap the emission area EMA of the first sub-pixel SPXL1 in a plan view.

The second wavelength conversion pattern WCP2 may be disposed to overlap an emission area EMA of the second sub-pixel SPXL2. For example, the second wavelength conversion pattern WCP2 may be provided between banks BNK, to overlap the emission area EMA of the second sub-pixel SPXL2 in a plan view.

The light transmission pattern LTP may be disposed to overlap an emission area EMA of the third sub-pixel SPXL3. For example, the light transmission pattern LTP may be provided between banks BNK, to overlap the emission area EMA of the third sub-pixel SPXL3 in a plan view.

In accordance with an embodiment, the first wave conversion pattern WCP1 may include first color conversion particles for converting light of a third color, which may be emitted from a light emitting element LD, into light of a first color. In an example, in case that the light emitting element LD is a blue light emitting element emitting light of blue, and the first sub-pixel SPXL1 is a red pixel, the first wavelength conversion pattern WCP1 may include a first quantum dot for converting light of blue, which may be emitted from the blue light emitting element, into light of red.

For example, the first wavelength conversion pattern WCP1 may include first quantum dots dispersed in a matrix material such as base resin. The first quantum dot may absorb blue light and emit red light by shifting a wavelength of the blue light according to energy transition. In case that the first sub-pixel SPXL1 is a pixel of another color, the first wavelength conversion pattern WCP1 may include a first quantum dot corresponding to the color of the first sub-pixel SPXL1.

In accordance with an embodiment, the second wavelength conversion pattern WCP2 may include second color conversion particles for converting light of the third color, which may be emitted from the light emitting element LD, into light of a second color. In an example, in case that the light emitting element LD is a blue light emitting element emitting light of blue, and the second sub-pixel SPXL2 is a green pixel, the second wavelength conversion pattern WCP2 may include a second quantum dot for converting light of blue, which may be emitted from the blue light emitting element, into light of green.

For example, the second wavelength conversion pattern WCP2 may include second quantum dots dispersed in a matrix material such as base resin. The second quantum dot may absorb blue light and emit green light by shifting a wavelength of the blue light according to energy transition. In case that the second sub-pixel SPXL2 is a pixel of another color, the second wavelength conversion pattern WCP2 may include a second quantum dot corresponding to the color of the second sub-pixel SPXL2.

The first quantum dot and the second quantum dot may have shape such as a spherical shape, a pyramid shape, a multi-arm shape, a cubic nano particle, a nano wire, a nano fabric, or a nano plate particle. However, the disclosure is not necessarily limited thereto, and the shape of the first quantum dot and the second quantum dot may be variously changed.

In an example, light of blue having a relatively short wavelength in a visible light band may be incident into the first quantum dot and the second quantum dot, so that absorption coefficients of the first quantum dot and the second quantum dot can be increased. Accordingly, the efficiency of light finally emitted from the first sub-pixel SPXL1 and the second sub-pixel SPXL2 can be improved, and excellent color reproduction can be ensured. The pixel unit of the first to third sub-pixels SPXL1, SPXL2, and SPXL3 may be configured by using light emitting elements LD of the same color (e.g., blue light emitting elements), so that the manufacturing efficiency of the display device can be improved.

In accordance with an embodiment, the light transmission pattern LTP may be provided to efficiently use light of the third color emitted from the light emitting element LD. In an example, in case that the light emitting element LD is a blue light emitting element emitting light of blue, and the third sub-pixel SPXL3 is a blue pixel, the light transmission pattern LTP may include at least one kind of light scattering particles to efficiently use light emitted from the light emitting element LD.

For example, the light transmission pattern LTP may include light scattering particles dispersed in a matrix material such as base resin. In an example, the light transmission pattern LTP may include light scattering particles such as silica, but the material constituting the light scattering particles is not limited thereto.

The light scattering particles are not to be disposed in only the emission area EMA of the third sub-pixel SPXL3. In an example, the light scattering particles may be selectively included even at the inside of the first wavelength conversion pattern WCP1 and/or the second wavelength conversion pattern WCP2.

The color filter part CFL may be disposed on the second capping layer CAP2. The color filter part CFL may be disposed between the optical layer OPL and the upper film part UFL. The color filter part CFL may be provided throughout the first to third sub-pixels SPXL1, SPXL2, and SPXL3.

The color filter part CFL may include color filters CF1, CF2, and CF3, a planarization layer PLA, and an overcoat layer OC.

In accordance with an embodiment, the color filters CF1, CF2, and CF3 may be disposed on the second capping layer CAP2. In a plan view, the color filters CF1, CF2, and CF3 may overlap the emission areas EMA of the first to third sub-pixels SPXL1, SPXL2, and SPXL3.

In accordance with an embodiment, a first color filter CF1 may allow light of the first color to be transmitted therethrough, and may allow light of the second color and light of the third color not to be transmitted therethrough. In an example, the first color filter CF1 may include a colorant of the first color.

In accordance with an embodiment, a second color filter CF2 may allow light of the second color to be transmitted therethrough, and may allow light of the first color and light of the third color not to be transmitted therethrough. In an example, the second color filter CF2 may include a colorant of the second color.

In accordance with an embodiment, a third color filter CF3 may allow light of the third color to be transmitted therethrough, and may allow light of the first color and light of the second color not to be transmitted therethrough. In an example, the third color filter CF3 may include a colorant of the third color.

In accordance with an embodiment, the planarization layer PLA may be provided over the color filters CF1, CF2, and CF3. The planarization layer PLA may cover the color filters CF1, CF2, and CF3. The planarization layer PLA may cancel a step difference occurring due to the color filters CF1, CF2, and CF3. The planarization layer PLA may be provided throughout the first to third sub-pixels SPXL1, SPXL2, and SPXL3.

In accordance with an embodiment, the planarization layer PLA may include an organic material such as acryl resin, epoxy resin, phenolic resin, polyamides resin, polyimides resin, unsaturated polyesters resin, poly-phenylene ethers resin, poly-phenylene sulfides resin, benzocyclobutene (BCB), or a combination thereof. However, the disclosure is not necessarily limited thereto, and the planarization layer PLA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The overcoat layer OC may be disposed on the planarization layer PLA. The overcoat layer OC may be disposed between the upper film part UFL and the color filter part CFL. The overcoat layer OC may be provided throughout the first to third sub-pixels SPXL1, SPXL2, and SPXL3. The overcoat layer OC may cover a lower member including the color filter part CFL. The overcoat layer OC may prevent moisture or air from infiltrating into the above-described lower member. Also, the overcoat layer OC may protect the above-described lower member from a foreign matter such as dust.

In accordance with an embodiment, the overcoat layer OC may include an organic material such as acryl resin, epoxy resin, phenolic resin, polyamides resin, polyimides resin, unsaturated polyesters resin, poly-phenylene ethers resin, poly-phenylene sulfides resin, benzocyclobutene (BCB), or a combination thereof. However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The sectional structure of the pixel PXL in accordance with the third embodiment of the disclosure will be described with reference to FIG. 13. Descriptions of portions redundant or similar to those described above will be simplified or omitted.

Referring to FIG. 13, the pixel PXL in accordance with the third embodiment of the disclosure may be different from the pixel PXL in accordance with the second embodiment of the disclosure (see FIG. 12) at least in that the color conversion part CCL may be disposed in a layer different from that of the display element part DPL.

In accordance with an embodiment, the color conversion part CCL may be disposed on the display element part DPL. For example, the first capping layer CAP1 may encapsulate (or cover) the area in which the light emitting elements LD may be disposed, and the color conversion part CCL may be disposed on the first capping layer CAP1.

In accordance with an embodiment, the color conversion part CCL may further include a light blocking layer LBL. The light blocking layer LBL may be disposed on the display element part DPL. The light blocking layer LBL may be disposed between the first capping layer CAP1 and the second capping layer CAP2. The light blocking layer LBL may be disposed to surround the first wavelength conversion pattern WCP1, the second wavelength conversion pattern WCP2, and the light transmission pattern LTP at a boundary of the first to third sub-pixels SPXL1, SPXL2, and SPXL3.

The light blocking layer LBL may define the emission area EMA and the non-emission area NEA. In an example, the light blocking layer LBL may overlap the non-emission area NEA in a plan view. In an example, an area in which the light blocking layer LBL is not disposed may be defined as the emission area EMA of each of the first to third sub-pixels SPXL1, SPXL2, and SPXL3.

In accordance with an embodiment, the light blocking layer LBL may be formed of an organic material including at least one of graphite, carbon black, black pigment, and black dye, or include a metal material including chromium (Cr). However, the material of the light blocking layer LBL is not limited as long as it may be a material capable of blocking transmission of light or absorbing light.

In accordance with an embodiment, the second capping layer CAP2 may encapsulate (or cover) the first wavelength conversion pattern WCP1, the second wavelength conversion pattern WCP2, and the light transmission pattern LTP.

In accordance with an embodiment, the low refractive layer LRL may be disposed between the second capping layer CAP2 and a third capping layer CAP3. Like the first capping layer CAP1 and the second capping layer CAP2, the third capping layer CAP3 may be configured as a single layer or a multi-layer, including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

The structure of the pixel PXL is not limited to that described with reference to FIGS. 11 to 13. In some embodiments, various arrangement relationships of components may be implemented.

Hereinafter, a manufacturing method of a light emitting element LD in accordance with an embodiment of the disclosure will be described with reference to FIGS. 14 to 19. Descriptions of portions redundant or similar to those described above will be simplified or omitted.

FIGS. 14 to 19 are process sectional views schematically illustrating a manufacturing method of a light emitting element in accordance with an embodiment of the disclosure. Hereinafter, for convenience of description, a manufacturing method of the light emitting element LD in accordance with the first embodiment of the disclosure will be described.

Figure 14:
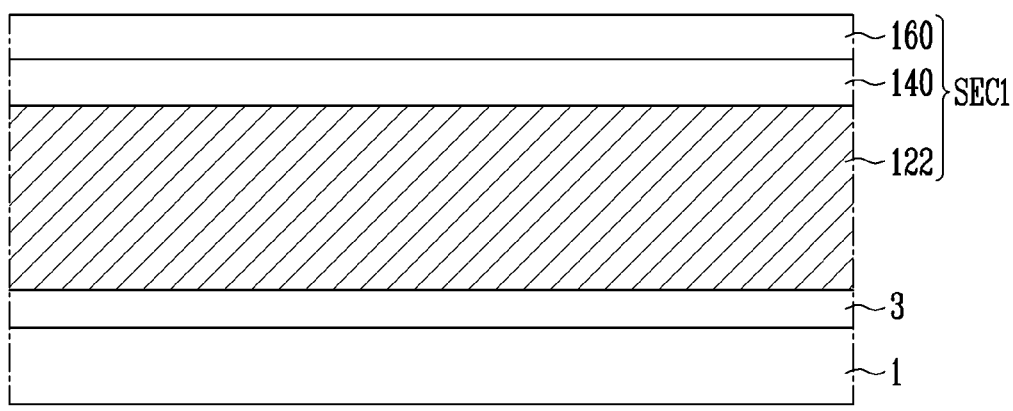
FIGS. 14 to 19 are process sectional views schematically illustrating a manufacturing method of a light emitting element in accordance with an embodiment of the disclosure.

Referring to FIG. 14, a stack substrate 1 may be prepared, and an undoped semiconductor layer 3 may be formed on the stack substrate 1. A first semiconductor layer SEC1 may be formed on the undoped semiconductor layer 3.

In accordance with an embodiment, the stack substrate 1 may be a base plate for stacking a target material. The stack substrate 1 may be a wafer for epitaxial growth of a material. In an example, the stack substrate 1 may be at least one of a sapphire substrate, a GaAs substrate, a Ga substrate, and an InP substrate, but the disclosure is not limited thereto.

For example, in case that a specific material satisfies a selectivity for manufacturing a light emitting element LD, and epitaxial growth of a material is smoothly performed, the specific material may be selected as a material of the stack substrate 1. The surface of the stack substrate 1 may be flat. The shape of the stack substrate 1 may be a polygonal shape including a rectangular shape or a circular shape, but the disclosure is not limited thereto.

In accordance with an embodiment, the undoped semiconductor layer 3 may be a semiconductor layer to which any dopant is not provided so as to suppress occurrence of a defect in a highly doped semiconductor layer 120 of the first semiconductor layer SEC1. In an example, the undoped semiconductor layer 3 may include at least one semiconductor material among InAlGaN, GaN, AlGaN, InGaN, AlN, and InN, and any separate dopant may not be provided to the undoped semiconductor layer 3. An etch rate of the undoped semiconductor layer 3 to which any dopant may not be provided may be different from that of a first semiconductor SEC1.

In accordance with an embodiment, the undoped semiconductor layer 3 may be formed through at least one process among Metal Organic Chemical Vapor Deposition (MOCVD), Molecular Beam Epitaxy (MBE), Vapor Phase Epitaxy (VPE), and Liquid Phase Epitaxy (LPE).

In this phase, in order to form the first semiconductor layer SEC1, a highly doped semiconductor layer 122 before etching, a defect prevention layer 140, and a strain relief layer 160 may be sequentially formed on the undoped semiconductor layer 3. The highly doped semiconductor layer 120, the defect prevention layer 140, and the strain relief layer 160 may be provided by epitaxial growth, and be provided by at least one of the methods listed as the forming method of the undoped semiconductor layer 3.

In accordance with an embodiment, a first relief layer and a second relief layer may be alternately disposed so as to form the strain relief layer 160. As described above, in an example, the first relief layer may be InGaN, and the second relief layer may be GAN.

In order to manufacture the light emitting element LD (see FIGS. 3 and 4) in accordance with the second embodiment of the disclosure, in this phase, the defect prevention layer 140, the highly doped semiconductor layer 122 before etching, and the strain relief layer 160 may be sequentially formed. For example, the defect prevention layer 140 may be formed before the highly doped semiconductor layer 122 before etching may be formed. Accordingly, in the light emitting element LD provided by performing a subsequent process, the highly doped semiconductor layer 120 may be disposed between the defect prevention layer 140 and the active layer AL.

In order to manufacture the light emitting element LD (see FIGS. 5 and 6) in accordance with the third embodiment of the disclosure, in this phase, the defect prevention layer 140, the highly doped semiconductor layer 122 before etching, the adjacent defect prevention layer 142, and the strain relief layer 160 may be sequentially formed. For example, the defect prevention layer 140 may be formed before the highly doped semiconductor layer 122 before etching may be formed, and the adjacent defect prevention layer 142 may be formed after the highly doped semiconductor layer 122 before etching may be formed. Accordingly, in the light emitting element LD provided by performing a subsequent process, the adjacent defect prevention layer 142 may be disposed between the highly doped semiconductor layer 120 and the strain relief layer 160.

Figure 15:
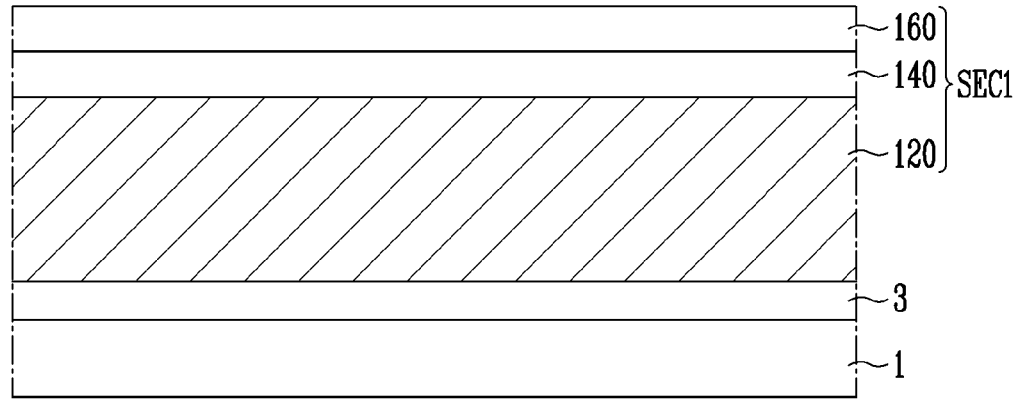

Referring to FIG. 15, the highly doped semiconductor layer 120 having a porous structure may be provided by performing an electro-chemical etching process on the highly doped semiconductor layer 122 before etching. In an example, a potassium hydroxide (KOH) or nitride acid ($HNO_3$) solution may be used to perform the electro-chemical etching process, but the disclosure is not limited thereto.

In accordance with an embodiment, the electro-chemical etching process may be performed before an active layer AL and a second semiconductor layer SEC2 may be formed. Accordingly, distortion of the structure of the active layer AL and the second semiconductor layer SEC2 can be prevented by the electro-chemical etching process.

In this phase, the porous structure may be formed in the highly doped semiconductor layer 122 before etching, to be provided as the highly doped semiconductor layer 120. The porous structure may be formed in the highly doped semiconductor layer 120, so that occurrence of strain between adjacent layers can be prevented, during a process for manufacturing the light emitting element LD by forming the highly doped semiconductor layer 120 on the stack substrate 1.

In accordance with an embodiment, the electro-chemical etching process may be selectively applied to the highly doped semiconductor layer 122 before etching, and may not be substantially applied to the undoped semiconductor layer 3, the defect prevention layer 140, and the strain relief layer 160. The electro-chemical etching process may be selectively applied based on a concentration of a dopant provided in an individual semiconductor layer, and an applied voltage. In order to selectively apply the electro-chemical etching process to the highly doped semiconductor layer 120, the magnitude of the applied voltage may be appropriately selected.

Figure 16:
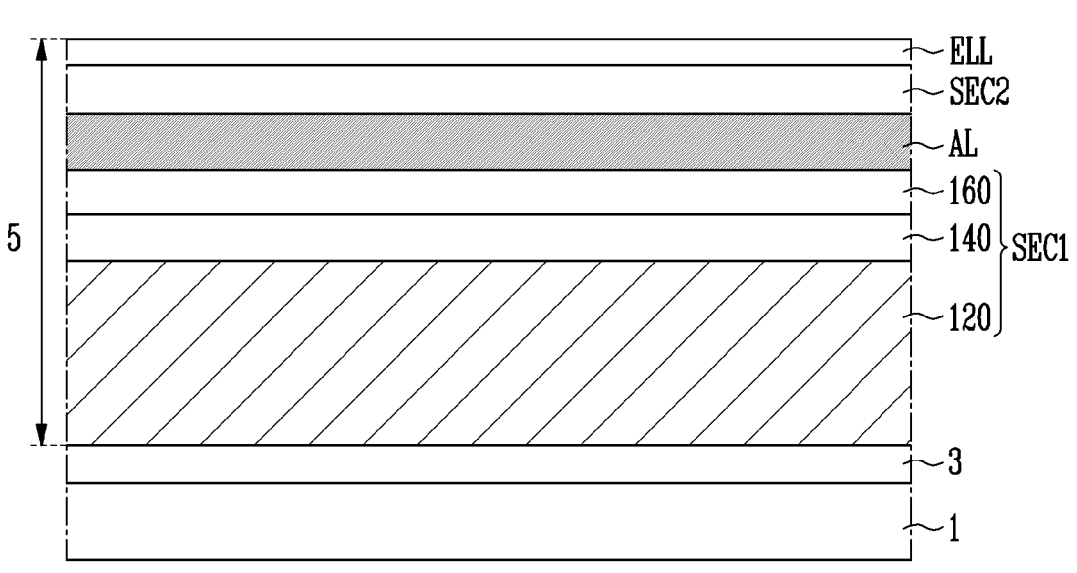

Referring to FIG. 16, the active layer AL, the second semiconductor layer SEC2, and an electrode layer ELL may be formed on the first semiconductor layer SEC1.

In this phase, the active layer AL, the second semiconductor layer SEC2, and the electrode layer ELL may be provided by epitaxial growth, and be provided by at least one of the methods listed as the forming method of the undoped semiconductor layer 3.

In accordance with an embodiment, the electrode layer ELL can minimize loss of light outputted from the active layer AL and emitted to the outside of the light emitting element LD. In an example, the electrode layer ELL may include a transparent metal oxide so as to improve an effect that current may be spread to the second semiconductor layer SEC2.

In accordance with an embodiment, the first semiconductor layer SEC1, the active layer AL, the second semiconductor layer SEC2, and the electrode layer ELL, which may be sequentially stacked on each other on the stack substrate 1 and the undoped semiconductor layer 3, may be provided (or formed) as a light emitting stack structure 5.

Figure 17:
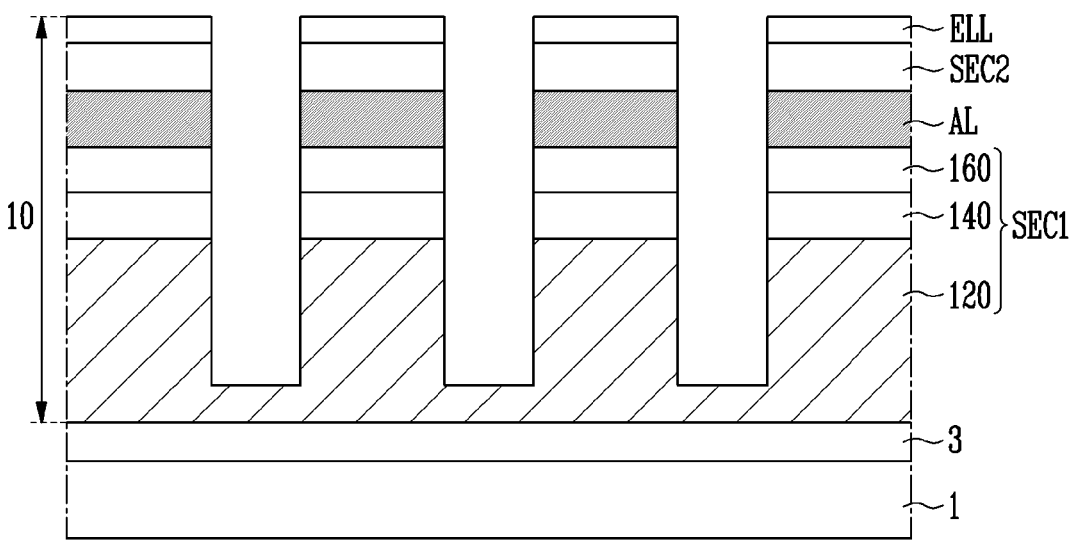

Referring to FIG. 17, a light emitting stack pattern 10 may be provided (or formed) by etching the light emitting stack structure 5 in a stacking direction. The light emitting stack pattern 10 may correspond to an area in which the light emitting stack structure 5 may be etched and removed along the stacking direction, and mean a structure in which the first semiconductor layer SEC1, the active layer AL, the second semiconductor layer SEC2, and the electrode layer ELL may be sequentially arranged. The stacking direction may mean a direction perpendicular to a main surface of the stack substrate 1.

In accordance with an embodiment, in order to form the light emitting stack pattern 10, a mask (not shown) may be disposed on the entire surface of the light emitting stack structure 5, and patterning may be performed at an interval of nanometer scale to micrometer scale through an etching process. In an example, the etching process for forming the light emitting stack pattern 10 may be a dry etching process. The dry etching process may be at least one of Reactive Ion Etching (RIE), Reactive Ion Beam Etching (RIBE), and Inductively Coupled Plasma Reactive Ion Etching (ICP-RIE).

Figure 18:
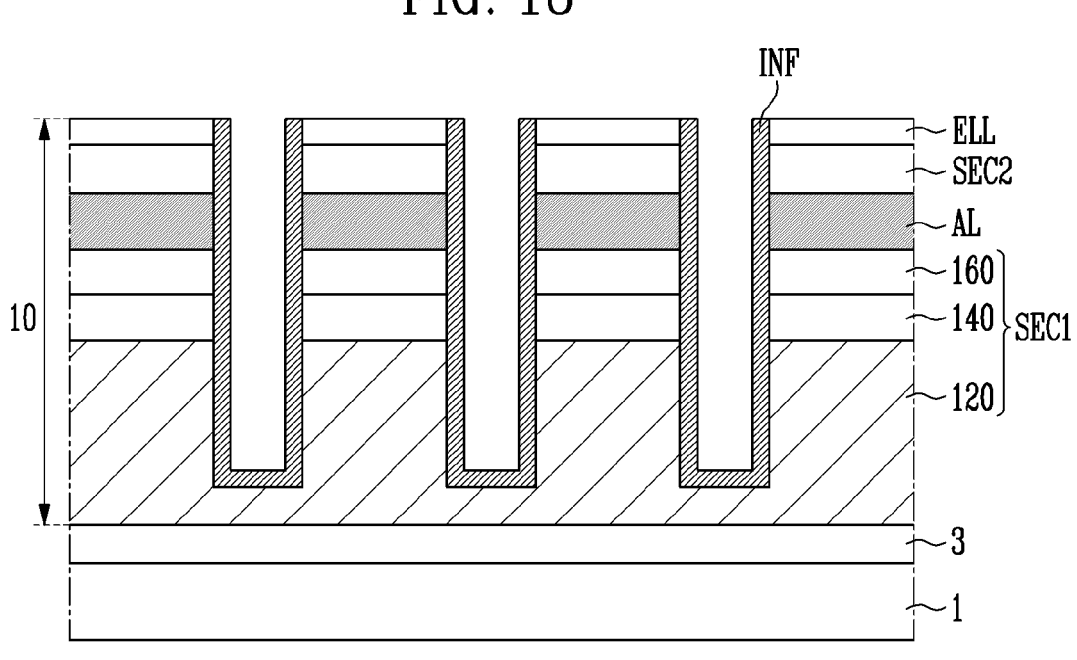

Referring to FIG. 18, an insulative film INF may be formed on the first semiconductor layer SEC1, the active layer AL, the second semiconductor layer SEC2, and the electrode layer ELL.

In accordance with an embodiment, the insulative film INF may cover the first semiconductor layer SEC1, the active layer AL, the second semiconductor layer SEC2, and the electrode layer ELL. Although a case where the insulative film INF may not be formed on another surface of the electrode layer ELL, which may not be in contact with the second semiconductor layer SEC2, is illustrated in FIG. 18, the disclosure is not limited thereto. For example, the insulative film INF may be removed through a separate process after the insulative film INF may be formed on another surface of the electrode layer ELL.

Figure 19:
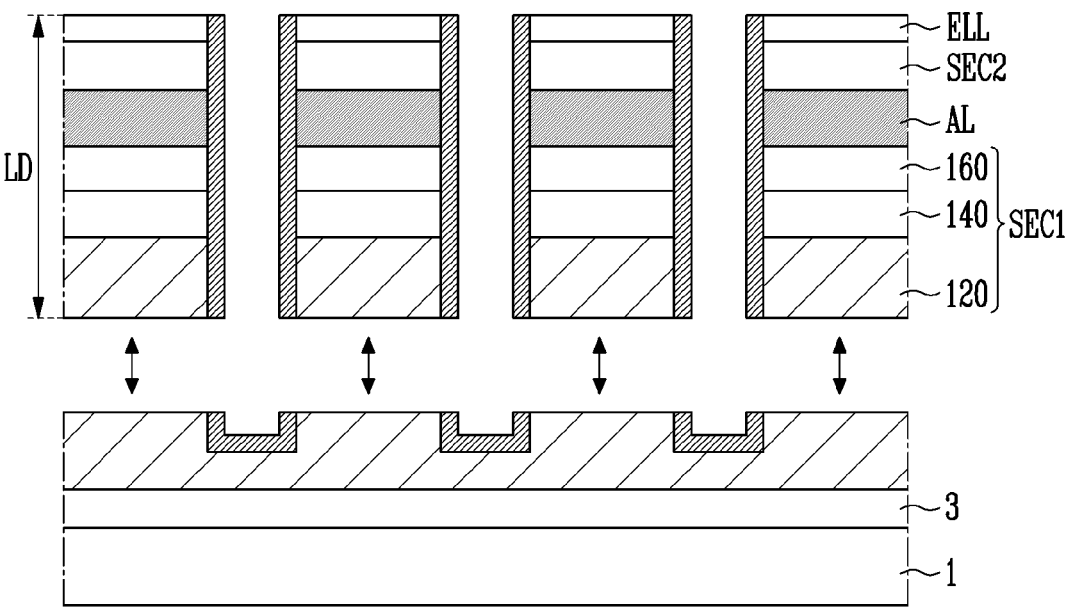

Referring to FIG. 19, the light emitting stack pattern 10 may be separated from the stack substrate 1 and the undoped semiconductor layer 3, thereby providing light emitting elements LD. A method of separating the light emitting elements LD is not limited to a specific example.

In this phase, a first metal may be coated on the light emitting stack pattern 10, and a second metal may be coated on a surface of a bonding layer, which is to be connected to the light emitting stack pattern 10. Bonding between the first metal and the second metal may be formed under temperature and pressure conditions, so that the bonding layer and the light emitting stack pattern 10 may be bonded to each other.

In this phase, the light emitting stack pattern 10 may be separated from the stack substrate 1 and the undoped semiconductor layer 3. In an example, the light emitting stack pattern 10 may be separated through a Laser Lift-Off (LLO) process or a Chemical Lift-Off (CLO) process. In accordance with an embodiment, the light emitting stack pattern 10 may be separated by sonication.

Subsequently, although not shown in any separate drawing, the bonding layer may be removed to provide light emitting elements LD. In some embodiments, a process of removing impurities located on the surface of the provided light emitting element LD may be further performed. The light emitting element LD may be dispersed in a solvent, to manufacture an ink (see 'INK' shown in FIG. 21) including the light emitting element LD and the solvent (see 'SLV' shown in FIG. 21).

Hereinafter, a manufacturing method of the display device DD in accordance with an embodiment of the disclosure will be described with reference to FIGS. 20 to 24. In particular, individual components in the display element part DPL will be described in FIGS. 20 to 24.

FIGS. 20 to 24 are sectional views schematically illustrating area EA1 shown in FIG. 10, and are process sectional views schematically illustrating a manufacturing method of a display device in accordance with an embodiment of the disclosure.

Figure 20:
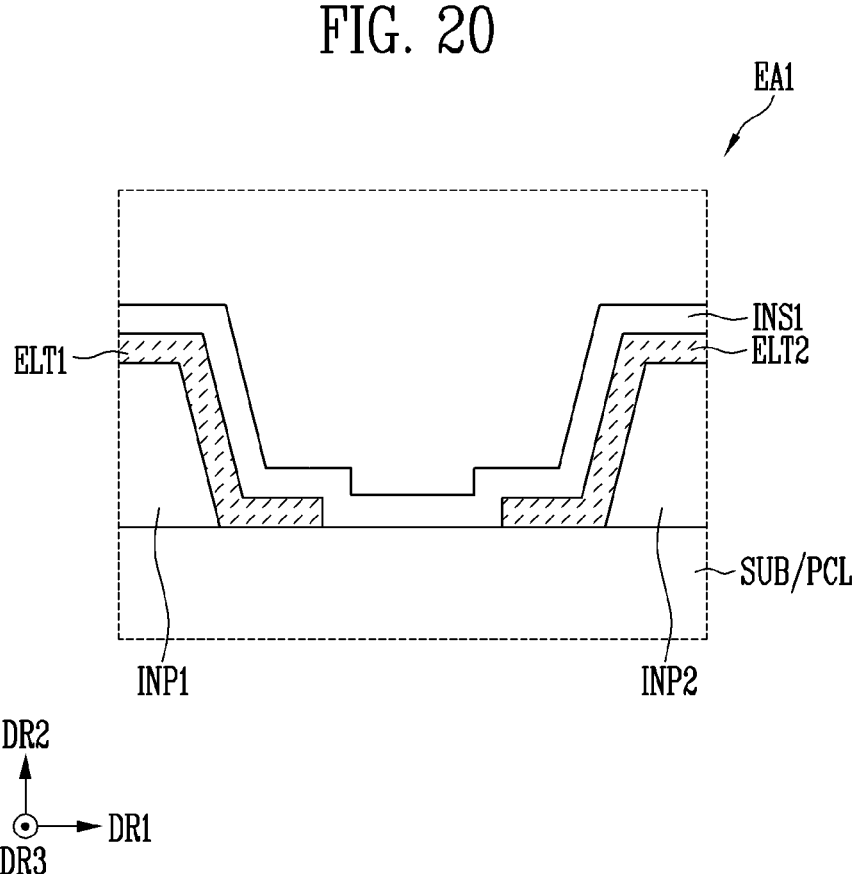
FIGS. 20 to 24 are sectional views schematically illustrating area EA1 shown in FIG. 10, and are process sectional views schematically illustrating a manufacturing method of a display device in accordance with an embodiment of the disclosure.

Referring to FIG. 20, a substrate SUB may be provided, and a pixel circuit part PCL may be disposed on the substrate SUB. A first insulating pattern INP1 and a second insulating pattern INP2 may be disposed on the pixel circuit part PCL, a first electrode ELT1 and a second electrode ELT2 may be disposed on the first insulating pattern INP1 and the second insulating pattern INP2, and a first insulating layer INS1 may be disposed over the first electrode ELT1 and the second electrode ELT2.

In this phase, individual components of the pixel circuit part PCL disposed on the substrate SUB may be ordinarily formed by patterning a conductive layer (or metal layer), an inorganic material, an organic material, or the like through a process using a mask.

In this phase, the first insulating pattern INP1 and the second insulating pattern INP2 may be formed (or deposited) on the pixel circuit part PCL. In accordance with an embodiment, the first insulating pattern INP1 and the second insulating pattern INP2 may have a shape protruding in the display direction (e.g., the third direction DR3) of the display device DD.

In this phase, although not shown in any separate drawing, after a base electrode may be deposited on the pixel circuit part PCL, the first electrode ELT1 and the second electrode ELT2 may be provided by etching at least a portion of the base electrode.

In this phase, the first electrode ELT1 and the second electrode ELT2 may be formed to respectively cover the first insulating pattern INP1 and the second insulating pattern INP2. Accordingly, in this phase, at least a portion of the first electrode ELT1 and the second electrode ELT2 may be provided as a reflective partition wall or bank.

In this phase, the first insulating layer INS1 may be formed (or deposited) to cover the first electrode ELT1 and the second electrode ELT2.

Figure 21:
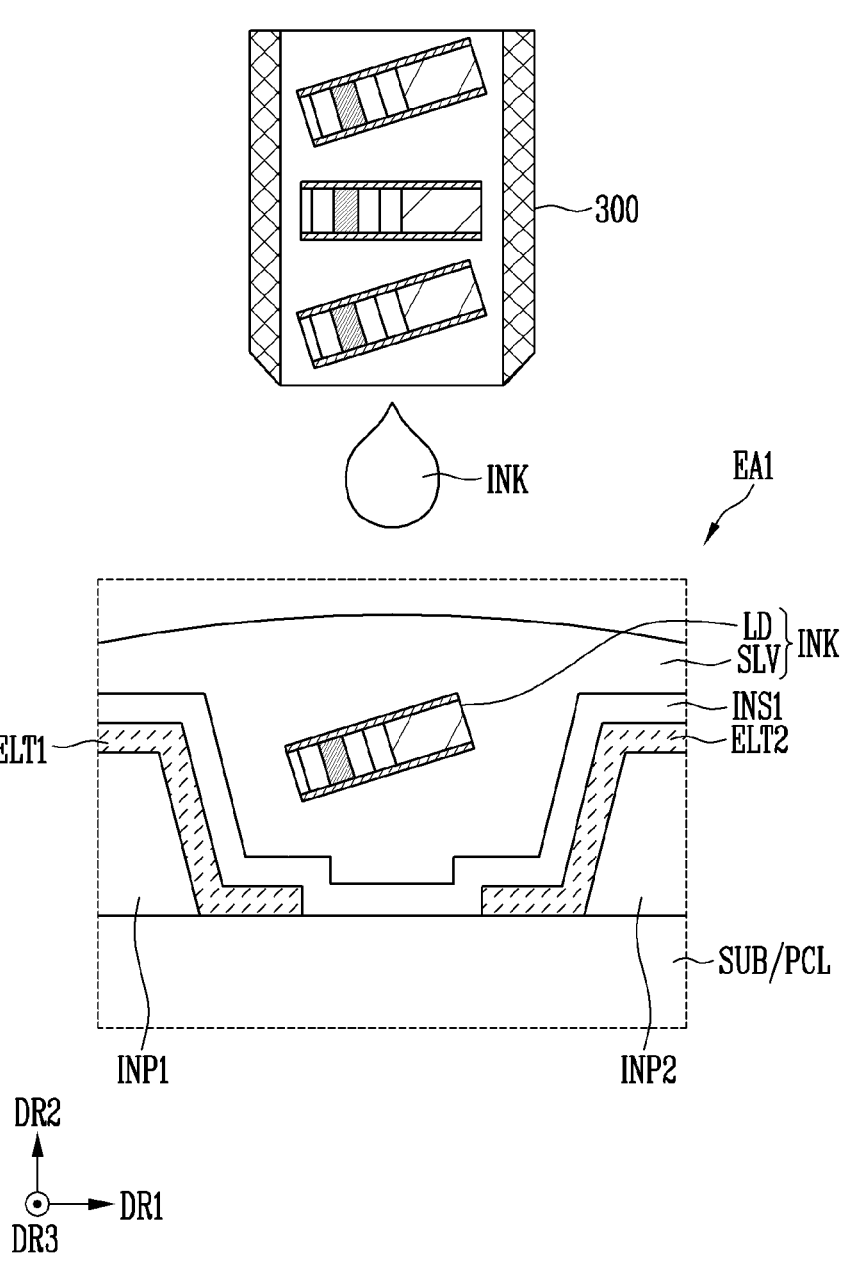

Referring to FIG. 21, an ink INK may be provided on the substrate SUB. The ink INK may be provided by a printing apparatus 200 capable of providing (or spraying) a fluid.

In accordance with an embodiment, the printing apparatus 300 may include a nozzle part that discharges a liquid fluid to the outside. The ink INK defined in this specification may mean a liquid mixture which can be discharged by the printing apparatus 300.

In this phase, the printing apparatus 300 may spray the ink INK onto an area in which a light emitting element LD is to be arranged.

In accordance with an embodiment, the ink INK may include a solvent SLV and the light emitting element LD. The light emitting element LD may be provided in plural, to be dispersed and provided in the solvent SLV having fluidity. In an example, the solvent SLV may mean a material of which phase may not be any solid phase such that the light emitting element LD may be dispersed and provided.

In this phase, the ink INK may be accommodated in an area. In an example, the ink INK may be provided in an area (or space) defined by a bank.

In this phase, the light emitting element LD may be provided to be disposed (e.g., face) randomly.

Figure 22:
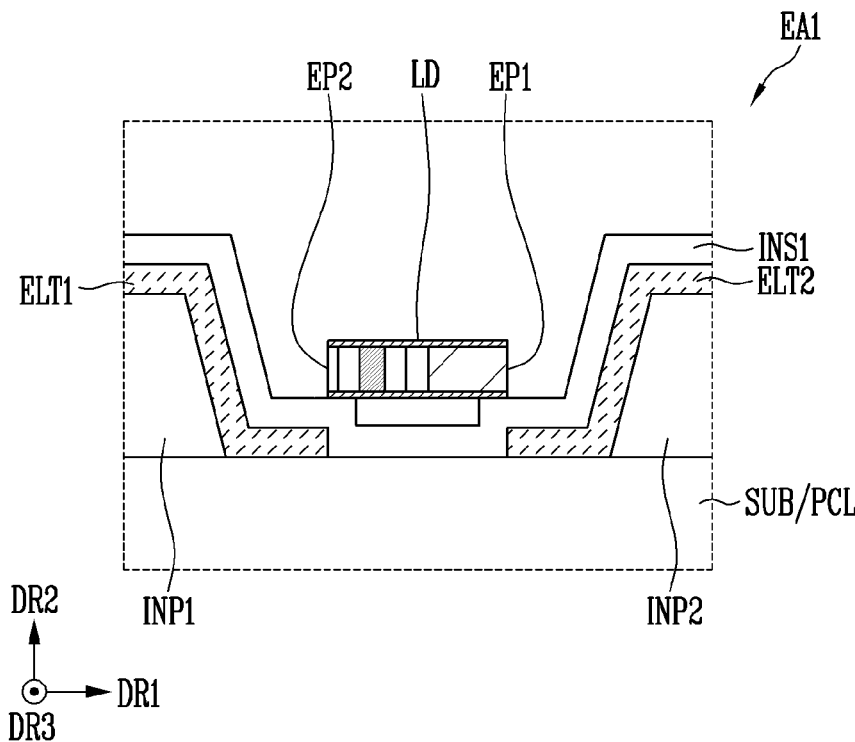

Referring to FIG. 22, the light emitting element LD may be arranged between the first electrode ELT1 and the second electrode ELT2.

In this phase, the light emitting element LD may be moved to an area in which the light emitting element LD is to be disposed by a dielectrophoresis (DEP) force generated based on an electrical signal provided to the first electrode ELT1 and the second electrode ELT2. Accordingly, the light emitting element LD may be disposed between the first electrode ELT1 and the second electrode ELT2.

In this phase, an electrical signal may be provided to the first electrode ELT1 and the second electrode ELT2, so that an electric field may be formed between the first electrode ELT1 and the second electrode ELT2.

In accordance with an embodiment, a first electrical signal may be provided to the first electrode ELT1, and a second electrical signal may be provided to the second electrode ELT2. The light emitting element LD may be arranged based on an electric field according to the first electrical signal and the second electrical signal. In an example, each of the first electrical signal and the second electrical signal may be an AC signal, and may be at least one of a sine wave, a triangular shape, a stepped wave, a square wave, a trapezoidal wave, and a pulse wave. However, the first electrical signal and the second electrical signal are not limited to a specific example.

In this phase, the light emitting element LD may be disposed such that the first semiconductor layer SEC1 of the light emitting element LD faces the second electrode ELT2 and the second semiconductor layer SEC2 of the light emitting element LD faces the first electrode ELT1.

Figure 23:
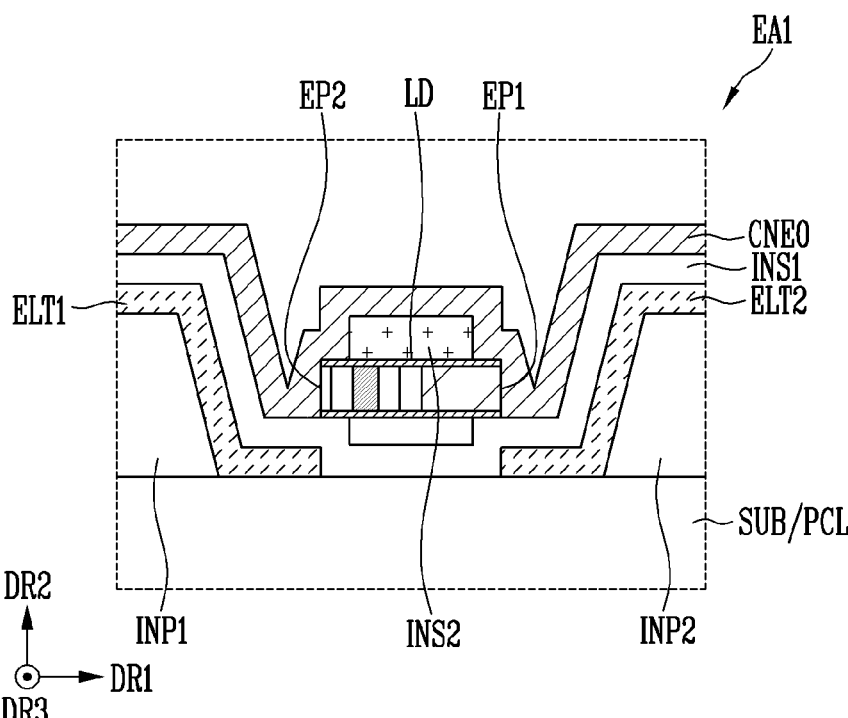

Referring to FIG. 23, a second insulating layer INS2 may be disposed on the light emitting element LD, and a base contact electrode CNE0 may be disposed on the first insulating layer INS1 and the second insulating layer INS2.

In this phase, the second insulating layer INS2 may be disposed to overlap the active layer AL of the light emitting element LD.

In this phase, the base contact electrode CNE0 may cover the first insulating layer INS1 and the second insulating layer INS2. The base contact electrode CNE0 may be electrically connected to the light emitting element LD. For example, a portion of the base contact electrode CNE0 may overlap the first end portion EP1 of the light emitting element LD when viewed on a plane, and another portion of the base contact electrode CNE0 may overlap the second end portion EP2 of the light emitting element LD when viewed on a plane.

Figure 24:
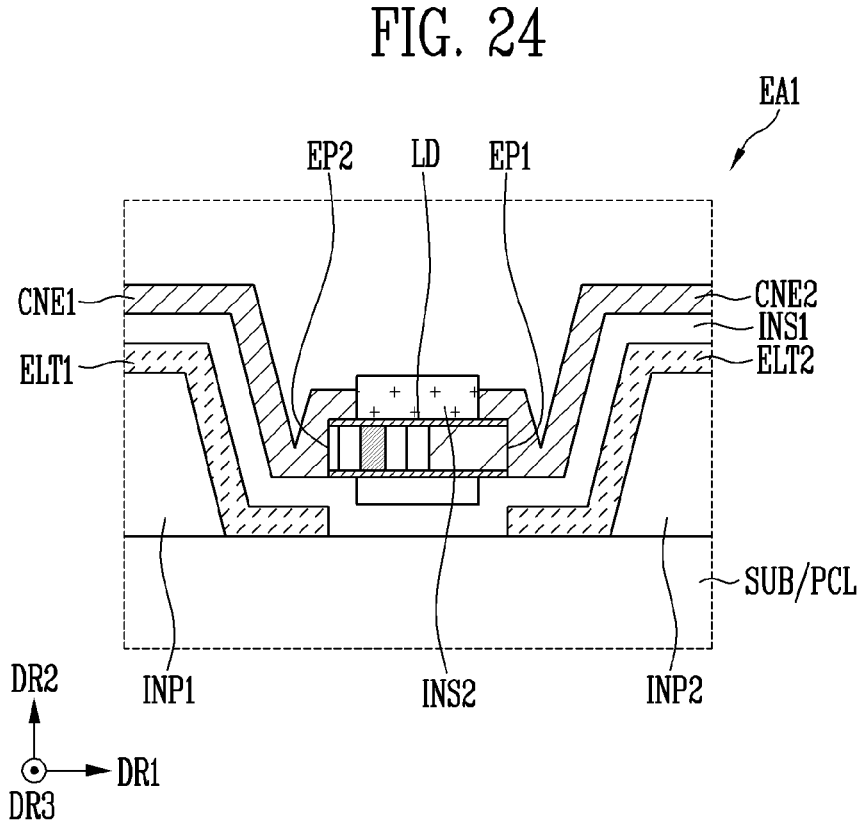

Referring to FIG. 24, a first contact electrode CNE1 and a second contact electrode CNE2 may be provided by etching the base contact electrode CNE0.

In this phase, at least a portion of the base contact electrode CNE0 may be removed, so that at least a portion of the second insulating layer INS2 may be exposed. Therefore, the first contact electrode CNE1 and the second contact electrode CNE2, which may be spaced apart from each other, may be provided.

In accordance with an embodiment, the first contact electrode CNE1 and the second contact electrode CNE2 may be portions of the base contact electrode CNE0, and may be formed at the same time. Accordingly, the first contact electrode CNE1 and the second contact electrode CNE2 may include the same material.

In this phase, the first contact electrode CNE1 may be electrically in contact with the second semiconductor layer SEC2 of the light emitting element LD, and the second contact electrode CNE2 may be electrically in contact with the first semiconductor layer SEC1 of the light emitting element LD.

Subsequently, although not shown in any separate drawing, a display element part DPL may be provided by disposing (or forming) a third insulating layer INS3 over the first contact electrode CNE1 and the second contact electrode CNE2. In some embodiments, a color conversion part CCL, an optical layer OPL, a color filter part CFL, and the like may be formed on the display element part DPL, thereby providing the display device DD in accordance with the embodiment of the disclosure.

In accordance with the disclosure, there can be provided a display device, a manufacturing method of a light emitting element, and a manufacturing method of a display device including a light emitting element manufactured thereby, in which a strain of layers included in the light emitting element may be reduced, and a defect may be decreased, thereby improving the light emission efficiency of the light emitting element.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure.

What is claimed is:

1. A display device comprising:
a first electrode and a second electrode above a substrate;
a light-emitting element above the first electrode and the second electrode;
a first contact electrode electrically connecting the first electrode and the light-emitting element to each other; and
a second contact electrode electrically connecting the second electrode and the light-emitting element to each other,
wherein the light-emitting element includes:
a first semiconductor layer including a semiconductor of a first type, and comprising a strain relief layer comprising a first relief layer comprising InGaN, and a second relief layer comprising GaN;
a second semiconductor layer including a semiconductor of a second type; and
an active layer between the first semiconductor layer and the second semiconductor layer, and
wherein the first semiconductor layer includes a doped semiconductor layer including a porous structure.

2. The display device of claim 1, wherein a dopant of a first concentration is provided in the doped semiconductor layer,
wherein the first semiconductor layer further includes a defect prevention layer above the doped semiconductor layer, and
wherein the defect prevention layer includes a dopant of a second concentration that is lower than the first concentration.

3. The display device of claim 2, wherein the defect prevention layer is between the doped semiconductor layer and the active layer.

4. The display device of claim 2, wherein the doped semiconductor layer is between the defect prevention layer and the active layer.

5. The display device of claim 4, wherein the first semiconductor layer further includes an adjacent defect prevention layer between the doped semiconductor layer and the active layer, and
wherein the adjacent defect prevention layer includes a dopant of a third concentration that is lower than the first concentration.

6. The display device of claim 2, wherein the strain relief layer has a superlattice structure.

7. The display device of claim 1, wherein the second relief layer and the first relief layer are alternately arranged.

8. The display device of claim 6, wherein the defect prevention layer is between the doped semiconductor layer and the strain relief layer.

9. The display device of claim 6, wherein the doped semiconductor layer is between the defect prevention layer and the strain relief layer.

10. The display device of claim 6, wherein the first semiconductor layer further includes an adjacent defect prevention layer between the doped semiconductor layer and the active layer, wherein the adjacent defect prevention layer includes a dopant of a third concentration lower than the first concentration, wherein the doped semiconductor layer is between the defect prevention layer and the adjacent defect prevention layer, and wherein the adjacent defect prevention layer is between the doped semiconductor layer and the strain relief layer.

11. The display device of claim 3, wherein a surface of the doped semiconductor layer is in contact with a surface of the defect prevention layer.

12. The display device of claim 11, wherein the defect prevention layer is between the doped semiconductor layer and the strain relief layer, and wherein another surface of the defect prevention layer is in contact with a surface of the strain relief layer.

13. The display device of claim 1, wherein a plurality of light-emitting elements are provided, and wherein at least portion of the plurality of light-emitting elements emit red light.

14. The display device of claim 1, wherein a concentration of a dopant doped into the doped semiconductor layer is about $10^{15}$ to about $10^{19}$ per unit area ($cm^3$).

15. The display device of claim 1, wherein the light-emitting element includes a first end portion and a second end portion, wherein the first contact electrode covers the second end portion of the light-emitting element, and wherein the second contact electrode covers the first end portion of the light-emitting element.

\* \* \* \* \*